US008346565B2

(12) United States Patent
Uhle et al.

(10) Patent No.: US 8,346,565 B2
(45) Date of Patent: Jan. 1, 2013

(54) APPARATUS AND METHOD FOR GENERATING AN AMBIENT SIGNAL FROM AN AUDIO SIGNAL, APPARATUS AND METHOD FOR DERIVING A MULTI-CHANNEL AUDIO SIGNAL FROM AN AUDIO SIGNAL AND COMPUTER PROGRAM

(75) Inventors: Christian Uhle, Erlangen (DE); Juergen Herre, Buckenhof (DE); Andreas Walther, Bamberg (DE); Oliver Hellmuth, Erlangen (DE); Christiaan Janssen, Berlin (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 825 days.

(21) Appl. No.: 12/440,058

(22) PCT Filed: Oct. 23, 2007

(86) PCT No.: PCT/EP2007/009197

§ 371 (c)(1),
(2), (4) Date: Jul. 29, 2009

(87) PCT Pub. No.: WO2008/049587

PCT Pub. Date: May 2, 2008

(65) Prior Publication Data

US 2010/0030563 A1 Feb. 4, 2010

(30) Foreign Application Priority Data

Oct. 24, 2006 (DE) ........................ 10 2006 050 068

(51) Int. Cl.
*G10L 19/00* (2006.01)
*G10L 11/00* (2006.01)
*H04R 5/00* (2006.01)
*H03G 3/00* (2006.01)

(52) U.S. Cl. ............ 704/500; 704/270; 381/17; 381/63

(58) Field of Classification Search ........................ None
See application file for complete search history.

(56) References Cited

U.S. PATENT DOCUMENTS 5,241,690 A 8/1993 Larsson et al.

(Continued)

FOREIGN PATENT DOCUMENTS

WO 97/09842 A2 3/1997

OTHER PUBLICATIONS

Liu et al., "Compression Artifacts in Perceptual Audio Coding", Audio Engineering Society Convention Paper 6872, Presented at the 121st Convention, Oct. 5-8, 2006.*

(Continued)

*Primary Examiner* — Brian Albertalli
(74) *Attorney, Agent, or Firm* — Keating & Bennett, LLP

(57) ABSTRACT

An apparatus for generating an ambient signal from an audio signal includes a compressor for lossy compression of a representation of the audio signal so as to obtain a compressed representation of the audio signal describing a compressed audio signal. The apparatus for generating the ambient signal further includes a calculator for calculating a difference between the compressed representation of the audio signal and the representation of the audio signal so as to obtain a discrimination representation. The apparatus further includes a provider for providing the ambient signal using the discrimination representation. An apparatus for deriving a multi-channel audio signal from an audio signal includes an apparatus for generating an ambient signal from an audio signal, an apparatus for providing the audio signal as a front-loudspeaker signal and an apparatus for providing the ambient signal as a back-loudspeaker signal.

31 Claims, 8 Drawing Sheets

U.S. PATENT DOCUMENTS

| | | | | |
|---|---|---|---|---|
| 6,229,453 | B1 | 5/2001 | Gardner et al. | |
| 7,076,071 | B2 * | 7/2006 | Katz | 381/307 |
| 7,412,380 | B1 * | 8/2008 | Avendano et al. | 704/216 |
| 7,965,848 | B2 * | 6/2011 | Villemoes et al. | 381/22 |
| 8,019,093 | B2 * | 9/2011 | Avendano et al. | 381/99 |
| 2005/0020277 | A1 | 1/2005 | Krumm et al. | |
| 2006/0165237 | A1 * | 7/2006 | Villemoes et al. | 381/20 |
| 2006/0165247 | A1 * | 7/2006 | Mansfield et al. | 381/307 |
| 2008/0097750 | A1 * | 4/2008 | Seefeldt et al. | 704/201 |
| 2008/0175394 | A1 * | 7/2008 | Goodwin | 381/1 |
| 2011/0081025 | A1 * | 4/2011 | Neoran et al. | 381/63 |

OTHER PUBLICATIONS

Jin et al., "A Hierarchical Lossless/Lossy Coding System for High Quality Audio up to 192 kHz Sampling 24 Bit Format," IEEE Transactions on Consumer Electronics, vol. 49, No. 3, Aug. 2003, pp. 759-764.

Official communication issued in counterpart International Application No. PCT/EP2007/009197, mailed on Feb. 27, 2008.

Dressler: "Dolby Surround Pro Logic II Decoder Principles of Operation," 2000 Dolby Laboratories, Inc.; http://www.dolby.com/assets/pdf/techlibrary/208 Dolby Surround Pro Logic Decoder.pdf; 2000; pp. 1-7.

DTS Technical Stuff: "An Overview of DTS Neo:6 Multi-Channel," DTS; http://www.dts.com/media/uploads/pdfs/DTS%20Neo6%20Overview,pdf; pp. 1-6, Retrieved Sep. 24, 2012.

Irwan et al.: "A Method to Convert Stereo to Multi-Channel Sound," Audio Engineering Society Conference Paper; Presented at the AES 19th International Conference; Jun. 2001; pp. 139-143.

Lee et al.: "Algorithms for Non-Negative Matrix Factorization," Proceedings of NIPS; 2001; 7 pages.

Avendano et al.: "Ambience Extraction and Synthesis From Stereo Signals for Multi-Channel Audio Up-Mix," 2000 IEEE; Proceedings of IEEE International Conference on Acoustics, Speech and Signal Processing; Orlando, FL; May 2002; pp. 1957-1960.

Walther et al.: "Transient Suppression in Ambience-Like Signals," Patent FPL-Fallnummer: 06F47242-IIS; 5 pages, Nov. 4, 2008.

Soulodre et al.: Ambience-Based Upmixing, Workshop Spatial Coding of Surround Sound: A Progress Report; AES Convention; Oct. 2004; pp. 1-19.

Uhle et al.: "Ambience Separation From Mono Recordings," XP009095956; AES 30th International Conference on Intelligent Audio Environments 2007; Mar. 15-17, 2007; pp. 138-145.

Jin et al.: "A Hierarchical Lossless/Lossy Coding System for High Quality Audio up to 192 kHz Sampling 24 Bit Format," XP001172126; 2003 IEEE; vol. 49, No. 3; Aug. 2003; pp. 759-764.

Faller: "Pseudostereophony Revisited," Audio Engineering Society Convention Paper Presented at the 118th Convention of the AES; XP002469053; May 2005; pp. 1-9.

Harman Kardon Technical Staff: "Logic 7 Explained," http://manuals.harman.com/HK/Technology%20Articles/logic7-TechSheet.pdf; 2 pages, Retrieved Sep. 24, 2012.

Lee et al.: "Learning the Parts of Objects by Nonnegative Matrix Factorization," In Letters to Nature; 1999; pp. 1-10.

Potard et al.: "Decorrelation Techniques for the Rendering of Apparent Sound Source Width in 3D Audio Displays," DAFx'04 Proceedings; Proc. of the 7th International Conference on Digital Audio Effects; Oct. 2004; pp. 280-284.

Schroeder: "An Artificial Stereophonic Effect Obtained From a Single Audio Signal," Journal of the Audio Engineering Society; vol. 6, No. 2; Apr. 1958; pp. 74-79.

Faller et al.: "Binaural Cue Coding—Part II: Schemes and Applications," IEEE Transactions on Speech and Audio Processing; vol. 11, No. 6; Nov. 2003; pp. 520-531.

Kendall: "The Decorrelation of Audio Signals and Its Impact on Spatial Imagery," Computer Music Journal; vol. 19, No. 4; pp. 71-87; 1995.

Goodwin et al.: "Enhancement of Audio Signals Using Transient Detection and Modification," Audio Engineering Society; Convention Paper 6255 Presented at 117th AES Convention; Oct. 2004; pp. 1-11.

Duxbury et al.: "Separation of Transient Information in Musical Audio Using Multiresolution Analysis Techniques," Proceedings of the COST G-6 Conference on Digital Audio Effects (DAFX-01); Dec. 2001; pp. 1-4.

Cichocki et al.: "New Algorithms for Non-Negative Matrix Factorization in Applications to Blind Source Separation," Proceedings of IEEE International Conference on Acoustics, Speech and Signal Processing; 2006; 4 pages.

Faller et al.: "Parametric Coding of Spatial Audio," Phd Thesis; Jun. 7, 2004; 172 pages.

* cited by examiner $$\begin{pmatrix} 3 & 0 & 0 \\ 0 & 2 & 0 \\ 0 & 0 & 1 \end{pmatrix} \approx \begin{pmatrix} 3 & 0 \\ 0 & 2 \\ 0 & 0 \end{pmatrix} \begin{pmatrix} 1 & 0 & 0 \\ 0 & 1 & 0 \end{pmatrix} = \begin{pmatrix} 3 \\ 0 \\ 0 \end{pmatrix} (1\ 0\ 0) + \begin{pmatrix} 0 \\ 2 \\ 0 \end{pmatrix} (0\ 1\ 0)$$

FIGURE 4A

APPARATUS AND METHOD FOR GENERATING AN AMBIENT SIGNAL FROM AN AUDIO SIGNAL, APPARATUS AND METHOD FOR DERIVING A MULTI-CHANNEL AUDIO SIGNAL FROM AN AUDIO SIGNAL AND COMPUTER PROGRAM

BACKGROUND OF THE INVENTION

The present invention generally relates to an apparatus and a method for generating an ambient signal from an audio signal, to an apparatus and a method for deriving a multi-channel audio signal from an audio signal, and to a computer program. Specifically, the present invention relates to a method and concept for calculating an ambient signal from an audio signal for upmixing mono audio signals for playback on multi-channel systems.

In the following, the motivation underlying the present invention will be discussed. Currently, multi-channel audio material is experiencing increasing popularity in consumer home environments as well. The main reason for this is that films on DVD media often offer 5.1 multi-channel sound. For this reason, even home users frequently install audio playback systems capable of reproducing multi-channel audio signals.

A corresponding setup may, for example, consist of three loudspeakers (exemplarily designated with L, C and R) arranged in the front, two loudspeakers (designated with $L_S$ and $R_S$) arranged behind or to a listener's back and one low-frequency effects channel (also referred to as LFE). The three loudspeakers arranged in the front (L, C, R) are in the following also referred to as front loudspeakers. The loudspeakers arranged behind and in the back of the listener ($L_S$, $R_S$) are in the following also referred to as back loudspeakers.

In addition, it is to be noted that for reasons of convenience, the following details and explanations refer to 5.1 systems. The following details may, of course, also be applied to other multi-channel systems, with only small modifications to be made.

Multi-channel systems (such as a 5.1 multi-channel audio system) provide several well-known advantages over two-channel stereo reproduction. This is exemplified by the following advantages:

Advantage 1: improved front image stability, even of or out of the optimal (central) listening position. The "sweet spot" is enlarged by means of the center channel. The term "sweet spot" denotes an area of listening positions where an optimal sound impression may be perceived (by a listener).

Advantage 2: Establishing a better approximation of a concert hall impression or experience. Increased experience of "envelopment" and spaciousness is obtained by the rear-channel loudspeakers or the back channel loudspeakers.

Nevertheless, there is still a large amount of legacy audio contents consisting of only two ("stereo") audio channels such as on compact discs. Even very old recordings and old films and TV series are sold on CDs and/or DVDs that are available in mono quality and/or by means of a one-channel "mono" audio signal only.

Therefore, there are options for the playback of mono legacy audio material via a 5.1 multi-channel setup:

Option 1: Reproduction or playback of the mono channel through the center or through the center loudspeaker so as to obtain a true mono source.

Option 2: Reproduction or playback of the mono signal over the L and R loudspeakers (i.e. over the front left loudspeaker and the front right loudspeaker). This approach produces a phantom mono source having a wider perceived source width than a true mono source but having a tendency towards the loudspeaker closest to the listener when the listener is not seated in or at the sweet spot.

This method may also be used if a two-channel playback system is available only, and it makes no use of the extended loudspeaker setup (such as a loudspeaker setup with 5 or 6 loudspeakers). The C loudspeaker or center loudspeaker, the $L_S$ loudspeaker or rear left loudspeaker, the $R_S$ loudspeaker or rear right loudspeaker and the LFE loudspeaker or low-frequency effects channel loudspeaker remain unused.

Option 3: A method may be employed for converting the channel of the mono signal to a multi-channel signal using all of the 5.1 loudspeakers (i.e. all six loudspeakers used in a 5.1 multi-channel system). In this manner, the multi-channel signal benefits from the previously discussed advantages of the multi-channel setup. The method may be employed in real time or "on the fly" or by means of preprocessing and is referred to as upmix process or "upmixing".

With respect to audio quality or sound quality, option 3 provides advantages over option 1 and option 2. Particularly with respect to the signal generated for feeding the rear loudspeakers, however, the signal processing required is not obvious.

In literature, two different concepts for an upmix method or upmix process are described. These concepts are the "direct/Ambient Concept" and the "In-the-band Concept". The two concepts stated will be described in the following.

Direct/Ambient Concept

The "direct sound sources" are reproduced or played back through the three front channels such that they are perceived at the same position as in the original two-channel version. The term "direct sound source" is used here so as to describe sound coming solely and directly from one discrete sound source (e.g. an instrument) and exhibiting little or no additional sound, for example due to reflections from the walls.

In this scenario, the sound or the noise fed to the rear loudspeakers should only consist of ambience-like sound or ambience-like noise (that may or may not be present in the original recording). Ambience-like sound or ambience-like noise is not associated with one single sound source or noise source but contributes to the reproduction or playback of the acoustical environment (room acoustics) of a recording or to the so-called "envelopment feeling" of the listener. Ambience-like sound or ambience-like noise is further sound or noise from the audience at live performances (such as applause) or environmental sound or environmental noise added by artistic intent (such as recording noise, birdsong, cricket chirping sounds).

For illustration, FIG. 7 represents the original two-channel version (of an audio recording). FIG. 8 shows an upmixed rendition using the Direct/Ambient Concept.

In-the-Band Concept

Following the surrounding concept, often referred to as "In-the-band Concept", each sound or noise (direct sound as well as ambient noise) may be completely and/or arbitrarily positioned around the listener. The position of the noise or sound is independent of its properties (direct sound or direct noise or ambient sound or ambient noise) and depends on the specific design of the algorithm and its parameter settings only.

FIG. 9 represents the surrounding concept.

Summing up, FIGS. 7, 8 and 9 show several playback concepts. Here, FIGS. 7, 8 and 9 describe where the listener perceives the origin of the sound (as a dark plotted area). FIG. 7 describes the acoustical perception during stereo playback. FIG. 8 describes the acoustical perception and/or sound localization using the Direct/Ambient Concept. FIG. 9 describes the sound perception and/or sound localization using the surrounding concept.

The following section gives an overview over the conventional approaches regarding upmixing a one-channel or two-channel signal to form a multi-channel version. The literature teaches several methods for upmixing one-channel signals and multi-channel signals.

Non-Signaladaptive Methods

Most methods for generating a so-called "pseudo stereophonic" signal are non-signaladaptive. This means that they process any mono signal in the same manner, irrespectively of the contents of the signal. These systems often operate with simple filter structures and/or time delays so as to decorrelate the generated signals. An overall survey of such system may be found, for example, in [1].

Signaladaptive Methods

Matrix decoders (such as the Dolby Pro Logic II decoder, described in [2], the DTS NEO:6 decoder, described, for example, in [3] or the Harman Kardon/Lexicon Logic 7 decoder, described, for example, in [4]) are contained in almost every audio/video receiver currently sold. As a by-product of their actual or intended function, these matrix decoders are capable of performing blind upmixing.

The decoders mentioned use inter-channel differences and signaladaptive steering mechanisms so as to create multi-channel output signals.

Ambience Extraction and Synthesis from Stereo Signals for Multi-Channel Audio Upmixing Avendano and Jot propose a frequency-domain technique so as to identify and extract the ambience information in stereo audio signals (see [5]).

The method is based on calculating an inter-channel-coherence index and a non-linear mapping function that is to enable the determination of time-frequency regions mainly consisting of ambience components or ambience portions in the two-channel signal. Then, ambience signals are synthesized and used to feed the surround channels of a multi-channel playback system.

A Method for Converting Stereo Sound to Multi-Channel Sound

Irwan and Aarts show a method for converting a signal from a stereo representation to a multi-channel representation (see [6]). The signal for the surround channels is calculated using a cross-correlation technique. A principal component analysis (PCA) is used for calculating a vector indicating the direction of the dominant signal. This vector is then mapped from a two-channel representation to a three-channel representation so as to generate the three front channels.

Ambience-Based Upmixing

Soulodre shows a system that generates a multi-channel signal from a stereo signal (see [7]). The signal is decomposed into so-called "individual source streams" and "ambience streams". Based on these streams, a so-called "aesthetic engine" synthesizes the multi-channel output. However, no further technical details regarding the decomposition step and the synthesis step are given.

Pseudostereophony Based on Spatial Cues

A quasi-signaladaptive pseudo-stereophonic process is described by Faller in [1]. This method uses a mono signal and given stereo recordings of the same signal. Additional spatial information or spatial cues are extracted from the stereo signal and used to convert the mono signal to a stereo signal.

SUMMARY

According to an embodiment, an apparatus for generating an ambient signal from an audio signal may have: means for a lossy compression of a representation of the audio signal so as to obtain a compressed representation of the audio signal; means for calculating a difference between the compressed representation of the audio signal and the representation of the audio signal so as to obtain a discrimination representation; and means for providing the ambient signal using the discrimination representation; wherein the means for lossy compression is configured to compress a spectral representation, describing a spectrogram of the audio signal so as to obtain as the compressed representation a compressed spectral representation of the audio signal.

According to another embodiment, an apparatus for deriving a multi-channel audio signal having a front-loudspeaker signal and a back-loudspeaker signal from an audio signal may have: an apparatus for generating an ambient signal from an audio signal according to any one of claims 1 to 18, wherein the apparatus for generating the ambient signal is configured for receiving the audio signal; an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

According to another embodiment, a method for generating an ambient signal from an audio signal may have the steps of: lossy compression of a spectral representation of the audio signal, describing a spectrogram of the audio signal, so as to obtain a compressed spectral representation of the audio signal; calculating a difference between the compressed spectral representation of the audio signal and the representation of the audio signal so as to obtain a discrimination representation; and providing the ambient signal using the discrimination representation.

According to another embodiment, a method for deriving a multi-channel audio signal having a front-loudspeaker signal and a back-loudspeaker signal from an audio signal may have the steps of: generating the ambient signal from the audio signal according to claim 24; providing the audio signal or a signal derived therefrom as the front-loudspeaker signal; and providing the ambient signal or a signal derived therefrom as the back-loudspeaker signal.

According to another embodiment, an apparatus for deriving a multi-channel audio signal having a front-loudspeaker signal and a back-loudspeaker signal from an audio signal may have: an apparatus for generating an ambient signal from an audio signal, wherein the apparatus for generating an ambient signal from an audio signal may have: means for a lossy compression of a representation of the audio signal so as to obtain a compressed representation of the audio signal; and means for calculating a difference between the compressed representation of the audio signal and the representation of the audio signal so as to obtain a discrimination representation, describing the difference between the representation of the audio signal and the compressed representation of the audio signal, and describing those portions of the audio signal not played back in the lossily compressed representation, and wherein the means for lossy compression is configured such that signal portions exhibiting regular distribution of the energy or carrying a large signal energy are to be included in the compressed representation; wherein the discrimination representation forms the ambient signal; an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

According to another embodiment, an apparatus for deriving a multi-channel audio signal having a front-loudspeaker signal and a back-loudspeaker signal from an audio signal may have: an apparatus for generating an ambient signal from an audio signal, wherein the apparatus for generating an ambient signal from an audio signal has: means for a lossy compression of a representation of the audio signal so as to obtain a compressed representation of the audio signal, means for calculating a difference between the compressed representation of the audio signal and the representation of the audio signal so as to obtain a discrimination representation, describing the difference between the representation of the audio signal and the compressed representation of the audio signal, and describing those portions of the audio signal not played back in the representation in the manner of lossy compression, and means for providing the ambient signal using the discrimination representation, wherein the means for lossy compression is configured such that signal portions exhibiting regular distribution of the energy or carrying a large signal energy are to be included in the compressed representation; wherein the apparatus for generating the ambient signal is configured for receiving the audio signal; an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

According to another embodiment, a method for deriving a multi-channel audio signal having a front-loudspeaker signal and a back-loudspeaker signal from an audio signal may have the steps of: generating the ambient signal from the audio signal, wherein the generation of the ambient signal from the audio signal has lossy compression of a representation of the audio signal so as to obtain a compressed representation of the audio signal; and calculating a difference between the compressed representation of the audio signal and the representation of the audio signal so as to obtain a discrimination representation forming the ambient signal, wherein the discrimination representation describes the difference between the representation of the audio signal and the compressed representation of the audio signal, and wherein the discrimination representation describes those portions of the audio signal not played back in the representation in the manner of lossy compression, and wherein the lossy compression is performed such that signal portions exhibiting regular distribution of the energy or carrying a large signal energy are to be included in the compressed representation; providing the audio signal or a signal derived therefrom as the front-loudspeaker signal; and providing the ambient signal or a signal derived therefrom as the back-loudspeaker signal.

According to another embodiment, a method for deriving a multi-channel audio signal having a front-loudspeaker signal and a back-loudspeaker signal from an audio signal may have the steps of: generating the ambient signal from the audio signal, wherein the generation of the ambient signal from the audio signal has lossy compression of a representation of the audio signal so as to obtain a compressed representation of the audio signal; calculating a difference between the compressed representation of the audio signal and the representation of the audio signal so as to obtain a discrimination representation, and providing the ambient signal using the discrimination representation, wherein the discrimination representation describes the difference between the representation of the audio signal and the compressed representation of the audio signal, and wherein the discrimination representation describes those portions of the audio signal not played back in the representation in the manner of lossy compression, and wherein the lossy compression is performed such that signal portions exhibiting regular distribution of the energy or carrying a large signal energy are to be included in the compressed representation; providing the audio signal or a signal derived therefrom as the front-loudspeaker signal; and providing the ambient signal or a signal derived therefrom as the back-loudspeaker signal.

Another embodiment may have a computer program for performing the inventive methods when the computer program runs on a computer.

It is a key idea of the present invention that an ambient signal may be generated from an audio signal in a particularly efficient manner by determining a difference between a compressed representation of the audio signal, which was generated by lossy compression of an original representation of the audio signal, and the original representation of the audio signal. That is, it has been shown that in using lossy compression, the difference between the original audio signal and the audio signal in lossy compression obtained from the original audio signal by the lossy compression substantially describes ambient signals, i.e., for example, noise-like or ambience-like or non-localizable signals.

In other words, when performing lossy compression, the compressed representation of the audio signal substantially comprises the localizable sound events or direct sound events. This is based on the fact that the localizable sound events in particular often feature specifically high energy and also specifically characteristic waveforms. Therefore, the localizable signals are to be processed by the lossy compression so that the compressed representation substantially comprises the localizable signals of high energy or a characteristic waveform.

However, in lossy compression, non-localizable ambient signals typically not exhibiting any specifically characteristic waveform are represented to a lesser extent by the compressed representation than the localizable signals. Thus, it has been recognized that the difference between the representation of the audio signal in the manner of lossy compression and the original representation of the audio signal substantially describes the non-localizable portion of the audio signal. Furthermore, it has been recognized that using the difference between the representation in the manner of lossy compression of the audio signal and the original representation of the audio signal as an ambient signal results in a particularly good auditory impression.

In other words, it has been recognized that lossy compression of an audio signal typically does not or only to a very little extent incorporate the ambient-signal portion of the audio signal and that, therefore, particularly the difference between the original representation of the audio signal and the representation in the manner of lossy compression of the audio signal approximates the ambient-signal portion of the audio signal well. Therefore, the inventive concept as defined by claim 1 is suitable for blind extraction of the ambient-signal portion from an audio signal.

The inventive concept is particularly advantageous in that an ambient signal may even be extracted from a one-channel signal without the existence of any additional auxiliary information. Furthermore, the inventive concept consists of algorithmically simple steps, i.e. performing lossy compression as well as calculating a difference between the representation of the audio signal in the manner of lossy compression and the original representation of the audio signal. Furthermore, the inventive method is advantageous in that no synthetic audio effects are introduced to the ambient signal. Therefore, the ambient signal may be free from reverberation as it may occur in the context of conventional methods for generating an ambient signal. Furthermore, it is to be noted that the ambient signal generated in the inventive manner typically no longer has any high-energy portions that may interfere with the auditory impression as in the context of lossy compression, such high-energy portions are contained in the representation of the audio signal in the manner of lossy compression and, therefore, do not or only very slightly occur in the difference between the representation in the manner of lossy compression and the original representation of the audio signal.

In other words, according to the invention, the ambient signal contains exactly those portions that are considered dispensable for the representation of the information content in the context of lossy compression. It is exactly this information, however, that represents the background noise.

Therefore, the inventive concept enables consistent separation of localizable information and background noise using lossy compression, wherein the background noise, being that which is suppressed and/or removed by lossy compression, serves as the ambient signal.

The present invention further provides an apparatus for deriving a multi-channel audio signal comprising a front-loudspeaker signal and a back-loudspeaker signal from an audio signal. Here, the apparatus for deriving the multi-channel audio signal comprises an apparatus for generating an ambient signal from the audio signal as described above. The apparatus for generating the ambient signal is configured to receive the representation of the audio signal. The apparatus for deriving the multi-channel audio signal further comprises an apparatus for providing the audio signal or an audio signal derived therefrom as the front-loudspeaker signal as well as back-loudspeaker-signal-providing apparatus for providing the ambient signal provided by the apparatus for generating the ambient signal or a signal derived therefrom as the back-loudspeaker signal. In other words, the apparatus for deriving the multi-channel audio signal uses the ambient signal generated by the apparatus for generating an ambient signal as the back-loudspeaker signal, whereas the apparatus for deriving the multi-channel audio signal further uses the original audio signal as the front-loudspeaker signal or as a basis for the front-loudspeaker signal. Therefore, the apparatus for deriving a multi-channel audio signal as a whole is capable of generating, based on one single original audio signal, both the front-loudspeaker signal and the back-loudspeaker signal of a multi-channel audio signal. Therefore, the original audio signal is used for providing the front-loudspeaker signal (or even directly represents the front-loudspeaker signal), whereas the difference between a representation in the manner of lossy compression of the original audio signal and a representation of the original audio signal serves for generating the back-loudspeaker signal (or is even directly used as the back-loudspeaker signal).

In addition, the present invention provides methods corresponding to the inventive apparatuses as far as their functionality is concerned.

The present invention further provides a computer program realizing the inventive methods.

BRIEF DESCRIPTION OF THE DRAWINGS

Embodiments of the present invention will be detailed subsequently referring to the appended drawings, in which:

FIG. 4*a* is an exemplary representation of an approximate representation of a matrix by a product of two matrices;

DETAILED DESCRIPTION OF THE INVENTION

Figure 1:
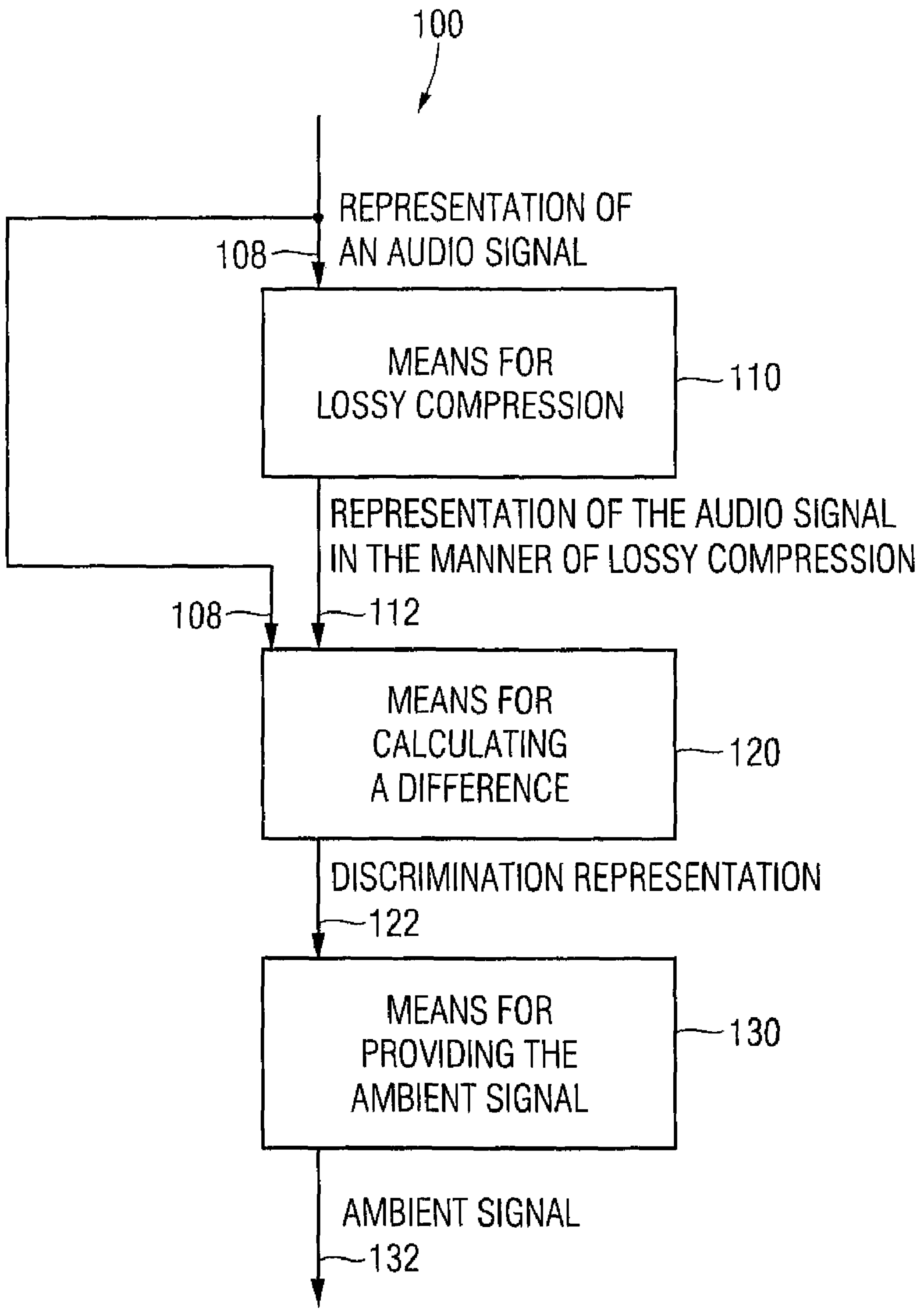
FIG. 1 is a block diagram of an inventive apparatus for generating an ambient signal from an audio signal according to an embodiment of the present invention.

FIG. 1 shows a block diagram of an inventive apparatus for generating an ambient signal from an audio signal according to an embodiment of the present invention.

The apparatus according to FIG. 1 is in its entirety designated with 100. The apparatus 100 is configured to receive an audio signal in a representation that can basically be arbitrarily selected. In other words, the apparatus 100 receives a representation of an audio signal. The apparatus 100 comprises means 110 for lossy compression of the audio signal or the representation of the audio signal. The means 110 is configured to receive the representation 108 of the audio signal. The means 110 generates from the (original) representation 108 of the audio signal a representation in a manner of lossy compression 112 of the audio signal.

The apparatus 100 further comprises means 120 for calculating a difference between the representation 112 of the audio signal in the manner of lossy compression of the audio signal and the (original) representation 108. The means 120 is therefore configured to receive the representation in the manner of lossy compression 112 of the audio signal as well as, in addition, the (original) representation 108 of the audio signal. Based on the (original) representation 108 of the audio signal and the representation in the manner of lossy compression 112 of the audio signal, the means 120 calculates a discrimination representation 122 describing a difference between the (original) representation 108 of the audio signal and the representation in the manner of lossy compression 112 of the audio signal.

The apparatus 100 further comprises means 130 for providing the ambient signal 132 using and/or based on and/or as a function of the discrimination representation 122.

Based on the above structural description of the apparatus 100, the operation of the apparatus 100 is briefly described in the following. The apparatus 100 receives a representation 108 of an audio signal. The means 110 generates a representation in the manner of lossy compression 112 of the audio signal. The means 120 calculates a discrimination representation 122 describing a difference between the representation 108 of the audio signal and the representation in the manner of lossy compression 112 of the audio signal and/or being a function of the difference mentioned. In other words, the discrimination representation 122 describes those signal portions of the (original) audio signal described by the representation 108, which are removed and/or not played back in the representation in the manner of lossy compression 112 of the audio signal by means 110 for lossy compression. As, typically, by the means 110, exactly those signal portions exhibiting an irregular curve are removed and/or not played back in the representation in the manner of lossy compression 112 of the audio signal, the discrimination representation 122 describes exactly those signal portions having an irregular curve or an irregular energy distribution, i.e., for example, noise-like signal portions. As, typically, the direct portions and/or "localizable signal portions", which are of particular importance to the listener, are to be played back by the front loudspeakers (and not by the "back" loudspeakers), the discrimination representation 122 is, concerning this matter, adapted to the requirements of the audio playback. Thus, the direct portions and/or localizable portions of the original audio signal are contained in the representation in the manner of lossy compression 112 of the audio signal in a manner substantially uncorrupted, and are therefore substantially suppressed in the discrimination representation 122 as is desired. On the other hand, in the representation in the manner of lossy compression 112 of the audio signal, the information portions having irregularly distributed energy and/or little localizability are reduced. The reason is that in lossy compression, as performed by the means 110 for lossy compression, information of regularly distributed energy and/or having high energy are carried over to the representation in the manner of lossy compression 112 of the audio signal, whereas portions of the (original) audio signal having irregularly distributed energy and/or lower energy are carried over to the representation in the manner of lossy compression 112 of the audio signal in an attenuated form or to a slight extent only. As a result, by means of the attenuation of the signal portions having an irregular energy distribution and/or of the low-energy signal portions of the audio signal occurring in the context of lossy compression, the discrimination representation 112 will still comprise a comparably large portion of the low-energy signal portions and/or signal portions having irregularly distributed energy. Exactly these signal portions not very rich in energy and/or signal portions with irregularly distributed energy, as they are described by the discrimination representation 122, represent information resulting in a particularly good and pleasant auditory impression in playback (by means of the back loudspeakers).

To sum up it may be stated that in the discrimination representation 122, signal portions having regularly distributed energy (i.e., for example, localizable signals) are suppressed or attenuated. In contrast to that, in the discrimination representation 122, signal portions having irregularly distributed energy (such as non-localizable signals) are not suppressed and not attenuated. Therefore, in the discrimination representation, signal portions having irregularly distributed energy are emphasized or accentuated as compared to signal portions having regularly distributed energy. Therefore, the discrimination representation is particularly suitable as the ambient signal.

In other words, in one embodiment, everything appearing repeatedly in the time-frequency representation is well approximated by the lossy compression.

Regular energy distribution here is meant to be, for example, energy distribution yielding a recurring pattern in a time-frequency representation or yielding a local concentration of energy in the time-frequency representation. Irregular energy distribution is, for example, energy distribution not yielding any recurring pattern nor a local concentration of energy in a time-frequency representation.

In other words, in one embodiment, the ambient signal substantially comprises signal portions having an unstructured energy distribution (for example unstructured in the time-frequency distribution), whereas the representation in the manner of lossy compression of the audio signal substantially comprises signal portions having structured energy distribution (for example structured in the time-frequency representation as described above).

Therefore, the means 130 for providing the ambient signal on the basis of the discrimination representation 122 provides an ambient signal that is particularly well adapted to the expectations of a human listener.

The means 110 for lossy compression may, for example, also be an MP3 audio compressor, an MP4 audio compressor, an ELP audio compressor or an SPR audio compressor.

Figure 2:
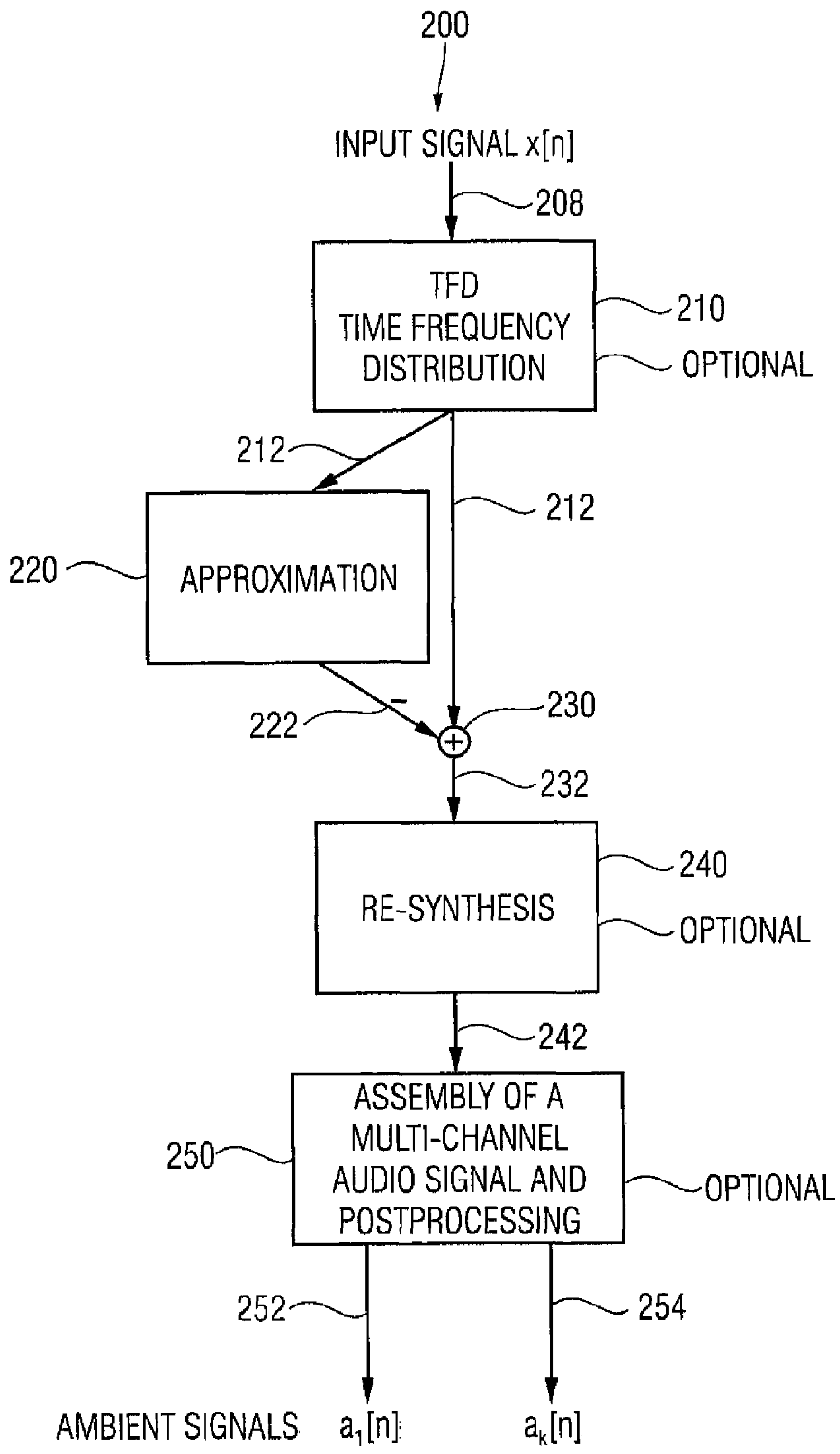
FIG. 2 is a block diagram of an inventive apparatus for generating an ambient signal from an audio signal according to an embodiment of the present invention.
Figure 3:
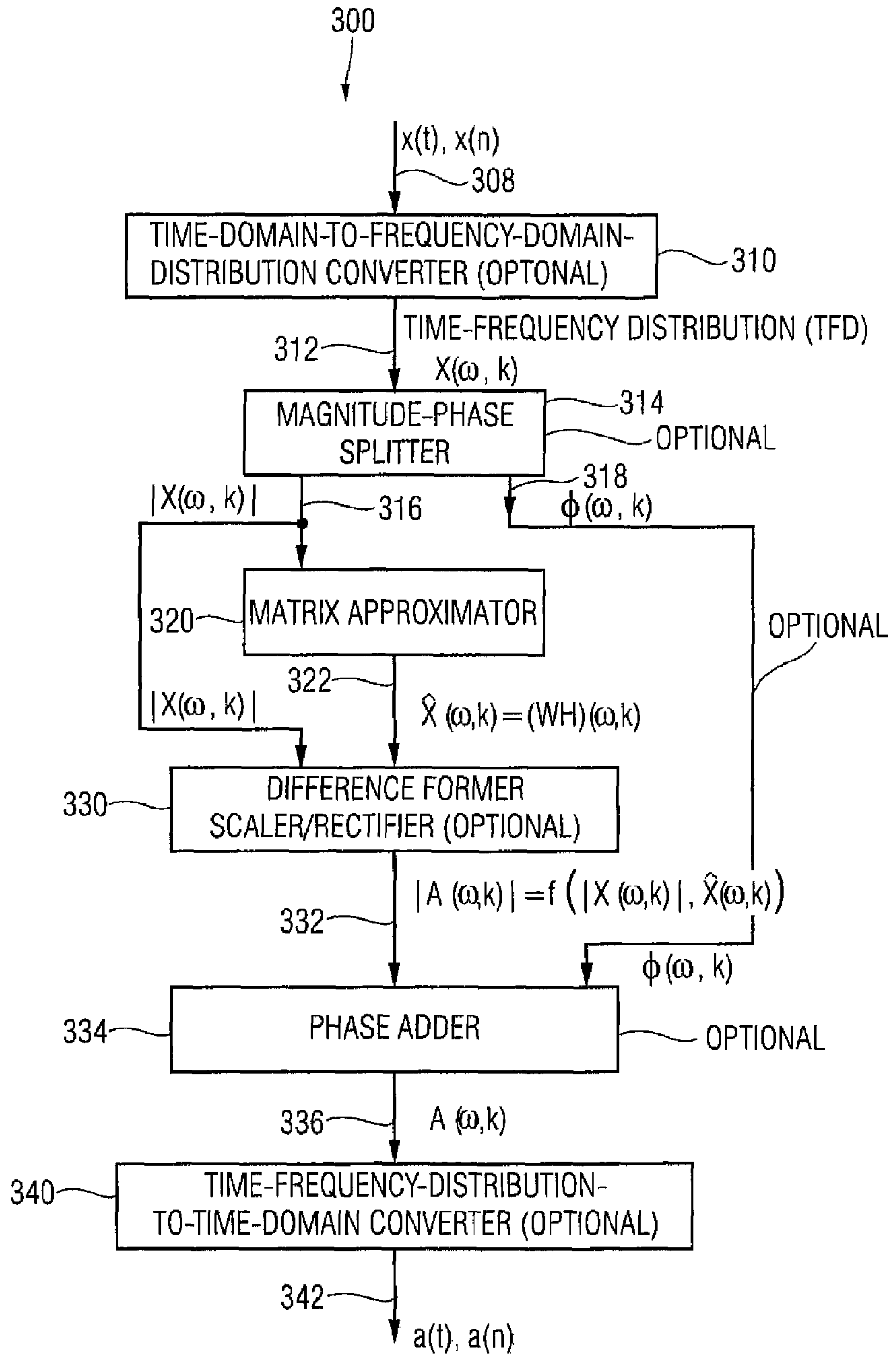
FIG. 3 is a detailed block diagram of an inventive apparatus for generating an ambient signal from an audio signal according to an embodiment of the present invention.

In the following and with respect to FIGS. 2 and 3, an embodiment of the present invention is described in greater detail. For this purpose, FIG. 2 shows a block diagram of an inventive apparatus for generating an ambient signal from an audio signal according to an embodiment of the present invention. Furthermore, FIG. 3 shows a detailed block diagram of an inventive apparatus for generating an ambient signal from an audio signal according to an embodiment of the present invention. In its entirety, the apparatus according to FIG. 2 is designated with 200, and, in its entirety, the apparatus according to FIG. 3 is designated with 300.

The apparatus 200 is configured to receive an input signal 208 present, for example, in the form of a time representation x[n]. The input signal 208 typically describes an audio signal.

The means 200 comprises a time-frequency-distribution provider 210. The time-frequency-distribution provider 210 is configured to generate a time-frequency distribution (TFD) from the input signal 208 present in a time representation x[n]. It is to be noted that the time-frequency-distribution provider 210 is optional. That is, a representation 212 of a time-frequency representation may also serve as the input signal of the apparatus 200 so that in this case the conversion of the input signal 208 (x[n]), which is present as a time signal, to the representation 212 of the time-frequency distribution may be omitted.

It is to be further noted that the representation 212 of the time-frequency distribution may, for example, be present in the form of a time-frequency distribution matrix. It is further to be noted that, for example, the matrix $X(\omega,k)$, which will be explained in greater detail in the following, or else the matrix $|X(\omega,k)|$ may serve as the representation 212 of the time-frequency distribution.

The means 200 further comprises approximation means 220, configured to receive the representation 212 of the time-frequency distribution and to generate an approximated representation 222 of the time-frequency representation 212 that is typically lossily compressed compared to the representation 212. In other words, the approximation or approximated representation 222 of the time-frequency distribution 212 is formed by the means for approximation 220, for example using a numerical optimization method as will be described in further detail in the following. It is assumed, however, that the approximation causes a deviation between the (original) representation 212 of the time-frequency distribution (being an original representation of the audio signal) and the approximated representation 222 of the time-frequency distribution. In one embodiment of the present invention, the difference between the original representation 212 and the approximated representation 222 of the time-frequency distribution is based on the fact that the means 220 for approximation is configured to perform a lossy approximation, in which signal portions exhibiting regular distribution of energy and/or carrying a large signal energy are to be carried over to the approximated representation, whereas signal portions exhibiting comparably irregularly distributed energy and/or comparably less signal energy are attenuated or dampened in the approximated representation 222 as compared to the signal portions having regularly distributed energy and/or a large signal energy.

The apparatus 200 further comprises a difference determinator 230 configured to receive the original representation 212 of the time-frequency distribution as well as the approximated representation 222 of the time-frequency representation so as to generate, based on a difference between the original representation 212 and the approximated representation 222, a discrimination representation 232 essentially describing the difference between the original representation 212 and the approximated representation 222 and/or being a function of the difference between the original representation 212 and the approximated representation 222. Details regarding the calculation of the discrimination representation 232 will be explained in the following.

The apparatus 200 further comprises re-synthesis means 240. The re-synthesis means 240 is configured to receive the discrimination representation 232 so as to generate a re-synthesized signal 242 based thereon. The re-synthesis means 240 may for example be configured to convert the discrimination representation 232, which is present in the form of a time-frequency distribution, to a time signal 242.

It is to be further noted that the re-synthesis means 240 is optional and may be omitted if direct reprocessing of the discrimination representation 232, which may, for example, be present in the form of a time-frequency distribution, if desired.

The means 200 further comprises optional means 250 for assembling a multi-channel audio signal and/or for postprocessing. The means 250 is, for example, configured to receive the re-synthesized signal 242 from the means 240 for re-synthesis and to generate a plurality of ambient signals 252, 254 (also denoted with $a_1[n], \ldots, a_k[n]$) from the re-synthesized signal 242.

The generation of the plurality of the ambient signals 252, 254 will be explained in greater detail in the following.

To sum up, it is shown that the present invention substantially concerns the computation of an ambient signal. The block diagram of FIG. 2 has served to provide a brief overview of the inventive concept and the inventive apparatus and the inventive method according to an embodiment of the present invention. The inventive concept may be summarized in short as follows:

A time-frequency distribution 212 (TFD) of the input signal 208 (x[n]) is (optionally) computed in (optional) means 210 for determining the time-frequency distribution. The computation will be explained in greater detail in the following. An approximation 220 of the time-frequency distribution 212 (TFD) of the input signal 208 (x[n]) is, for example, computed using a method for numerical approximation that will be described in greater detail in the following. This computation may, for example, be performed in the means 220 for approximation. By computing a distinction or difference between the time-frequency distribution 212 (TFD) of the input signal 208 (x[n]) and its approximation 212 (for example in the means 230 for calculating a difference), an estimation 232 of a time-frequency distribution (TFD) of the ambient signal is obtained. Thereupon, a re-synthesis of a time signal 242 of the ambient signal is performed (for example in the optional re-synthesis means 240). The re-synthesis will be explained in greater detail in the following. In addition, optional use is made of postprocessing (realized for example in the optional means 250 for assembling a multi-channel audio signal and/or for postprocessing) so as to improve the auditory impression of the derived multi-channel signal (consisting of, for example, ambient signals 252, 254). The optional postprocessing will also be explained in greater detail in the following.

Details regarding the individual processing steps shown in the context of FIG. 2 will be explained in the following. In doing so, reference is also made to FIG. 3, which shows a more detailed block diagram of an inventive apparatus for generating an ambient signal from an audio signal.

The apparatus 300 according to FIG. 3 is configured to receive an input signal 308 present, for example, in the form of a time-continuous input signal x(t) or in the form of a time-discrete input signal x[n]. Otherwise, the input signal 308 corresponds to the input signal 208 of the apparatus 200.

The apparatus 300 further comprises a time-signal-to-time-frequency-distribution converter 310. The time-signal-to-time-frequency-distribution converter 310 is configured to receive the input signal 308 and to provide a representation of a time-frequency distribution (TFD) 312. The representation 312 of the time-frequency distribution otherwise substantially corresponds to the representation 212 of the time-frequency distribution in the apparatus 200. It is to be further noted that in the following, the time-frequency distribution is also denoted with X(ω,k).

It is to be further noted that the time-frequency distribution X(ω,k) may also be the input signal of the apparatus 300, i.e., that the apparatus 310 may be omitted. The apparatus 300 further (optionally) comprises a magnitude-phase splitter 314. The magnitude-phase splitter 314 is used when the time-frequency distribution 312 may adopt complex (not purely real) values. In this case, the magnitude-phase splitter 314 is configured to provide a magnitude representation 316 of the time-frequency distribution 312 as well as a phase representation 318 of the time-frequency distribution 312, based on the time-frequency distribution 312. The magnitude representation of the time-frequency distribution 312 is otherwise also designated with $|X(\omega,k)|$. It is to be noted that the magnitude representation 316 of the time-frequency distribution 312 may be substituted for the representation 212 in the apparatus 200.

It is further to be noted that the use of the phase representation 318 of the time-frequency distribution 312 is optional. It is also to be noted that the phase representation 318 of the time-frequency distribution 312 is in some cases also designated with $\phi$ (ω, k).

It is further assumed that the magnitude representation 316 of the time-frequency distribution 312 is present in the form of a matrix.

The apparatus 300 further comprises a matrix approximator 320 configured to approximate the magnitude representation 316 of the time-frequency distribution 312 by a product of two matrices W, H, as it will be described in the following. The matrix approximator 320 substantially corresponds to the means 220 for approximation as it is used in the apparatus 200. The matrix approximator 320 therefore receives the magnitude representation 316 of the time-frequency distribution 312 and provides an approximation 322 of the magnitude representation 316. The approximation 322 is in come cases also designated with $\hat{X}$ (ω, k). Otherwise, the approximation 322 corresponds to the approximated representation 222 in FIG. 2.

The apparatus 300 further comprises a difference former 330 that receives both the magnitude representation 316 and the approximation 322. Furthermore, the difference former 330 provides a discrimination representation 332 that substantially corresponds to the representation |A (ω,k)| described in the following. Otherwise, it is to be noted that the discrimination representation 332 also substantially corresponds to the discrimination representation 232 in the apparatus 200.

The apparatus 300 further comprises a phase adder 334. The phase adder 334 receives the discrimination representation 332 as well as the phase representation 318 and therefore adds a phase to the elements of the discrimination representation 332 as described by the phase representation 318. Therefore, the phase adder 334 provides a discrimination representation 336 provided with a phase, which is also designated with A(ω,k). It is to be noted that the phase adder 334 may be regarded as optional, so that, if the phase adder 334 is omitted, the discrimination representation 332 may, for example, be substituted for the discrimination representation 336 provided with a phase. It is to be further noted that, depending on each particular case, both the discrimination representation 332 and the discrimination representation 336 provided with a phase may correspond to the discrimination representation 232.

The apparatus 300 further comprises an (optional) time-frequency-distribution-to-time-signal converter 340. The (optional) time-frequency-distribution-to-time-signal converter 340 is configured to receive the discrimination representation 336 provided with a phase (alternatively: the discrimination representation 332) and provide a time signal 342 (also designated with a(t) or a[n]) forming a time-domain representation (or time-signal representation) of the ambient signal.

It has to be further noted that the time-frequency-distribution-to-time-signal converter 340 substantially corresponds to the re-synthesis means 240 according to FIG. 2. Furthermore, the signal 342 provided by the time-frequency-distribution-to-time-signal converter 340 substantially corresponds to the signal 242, as it is shown in the apparatus 200.

Time-Frequency Distribution of the Input Signal

The following describes the manner in which a time-frequency distribution (TFD) of the input signal, i.e., for example, a representation 212, 312, may be calculated. Time-frequency distributions (TFD) are representations and/or illustrations of a time signal (i.e., for example, of the input signal 208 or the input signal 308) both versus time and also versus frequency. Among the manifold formulations of a time-frequency distribution (e.g. using a filter bank or a discrete cosine transform (DCT)), the short-time Fourier transform (STFT) is a flexible and computationally efficient method for the computation of the time-frequency distribution. The short-time Fourier transform (STFT) X(ω,k) with the frequency bin or frequency index X and the time index k is computed as a sequence of Fourier transforms of windowed data segments of the discrete time signal x[n] (i.e., for example, of the input signal 208, 308). Therefore, the following is true:

$$X(\omega, k) = \sum_{n=-\infty}^{\infty} x[n]w[n-m]e^{-j\omega n} \quad (1)$$

Here, w[n] denotes the window function. The relation of the index m to the frame index (or time index) k is a function of the window length and the quantity of an overlap of adjacent windows.

If the time-frequency distribution (TFD) is complex-valued (for example in the case of using a short-time Fourier transform (STFT)), in one embodiment, the further computation may be effected using absolute values of the coefficients of the time-frequency distribution (TFD). The absolute values and/or magnitudes of the coefficients of the time-frequency distribution (TFD) are also designated with |X(ω, k)|. In this case, a phase information φ(ω,k)=∠X(ω,k) is stored in the re-synthesis stage for later use. It is to be noted that in apparatus 300 the magnitude representation |X(ω,k)| is designated with 316. The phase information φ(ω,k) is designated with 318.

It is to be noted that X(ω,k) denotes individual Fourier coefficients (generally: individual coefficients of a time-frequency distribution) as they may be obtained, for example, by the STFT. In contrast, X(ω,k) denotes a matrix containing a plurality of coefficients (ω,k). For example, matrix $X(\omega,k_1)$ contains coefficients X(ω',k') for ω'=1, 2, . . . , n and k'=k1, k1+1, . . . , k1+m−1. Here, n is a first dimension of the matrix $X(\omega,k_1)$, for example a number of rows, and m is a second dimension of the matrix $X(\omega,k_1)$. Thus, for an element $X_{i,j}$ of the matrix $X(\omega,k_1)$ the following is true:

$$X_{i,j}=X(\omega=\omega_i, k=k_{1+j-1})$$

Here, the following is true:

$$1 \leqq j \leqq n$$

and $$1 \leqq i \leqq m.$$

Figure 4B:
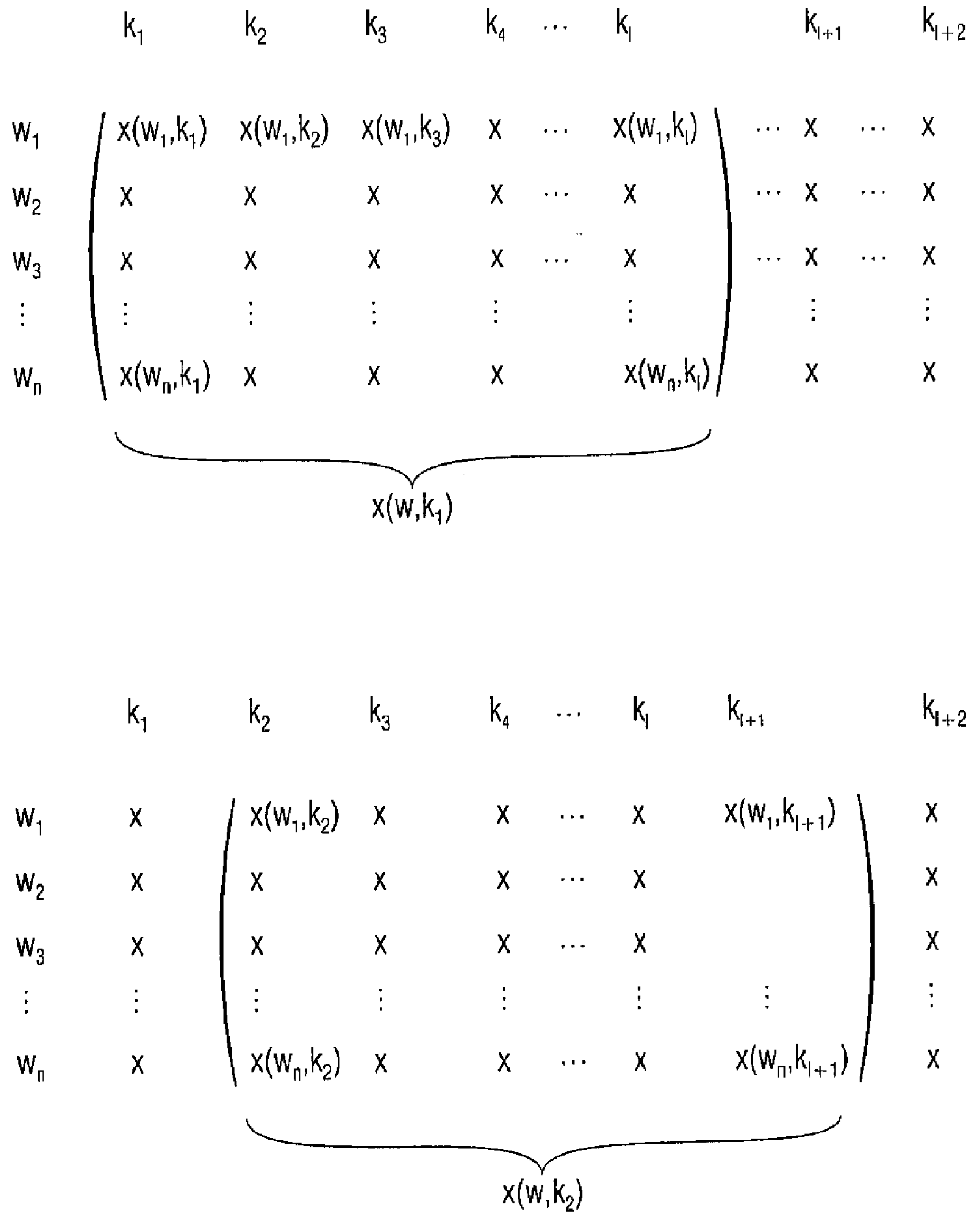
FIG. 4*b* is a schematic representation of a matrix X.

The context described is otherwise shown in FIG. 4*b*.

In other words, the matrix X(ω,k) comprises a plurality of time-frequency-distribution values X(ω,k).

It is to be further noted that in the following, the computation of a magnitude of a matrix, designated with |X|, denotes an element-wise magnitude formation unless represented otherwise.

Approximation of the Time-Frequency Distribution (TFD)

In the context of the present invention, according to an embodiment, an approximation of the time-frequency distribution of the input signal is computed using a numerical optimization method. The approximation of the time-frequency distribution as well as the numerical optimization method are described in the following.

An approximation $\hat{X}(\omega,k)$ of the matrix X(ω,k) is derived with the help of a numerical optimization method minimizing the error of the approximation. Here, minimization means a minimization with a relative error of not more than 50%, advantageously not more than 20%. Otherwise, a minimization may be a determination of an absolute or local minimum.

Otherwise, the approximation error is measured with the help of a distance function or a divergence function. The difference between a distance and a divergence is of a mathematical nature and is based on the fact that a distance is symmetrical in the sense that for a distance between two matrices A, B the following is true:

$$d(A,B)=d(B,A).$$

In contrast to that, the divergence may be unsymmetrical.

It is to be noted that the approximation of the time-frequency distribution or the time-frequency-distribution matrix X(ω,k) described in the following may, for example, be effected by means of the approximation means 220 or the matrix approximator 320.

It is to be further noted that the non-negative matrix factorization (NMF) is a suitable method for the computation of the approximation.

Non-Negative Matrix Factorization (NMF)

In the following, the non-negative matrix factorization is described. A non-negative matrix factorization (NMF) is an approximation of a matrix $V \in R^{n \times m}$ with non-negative elements, as a product of two matrices $W \in R^{n \times r}$ and $H \in R^{r \times m}$. Here, for the elements $W_{i,k}$ of the matrix W and $H_{i,k}$ of the matrix H, the following is true:

$$W_{i,k} \geqq 0; \text{ and}$$

$$H_{i,k} \geqq 0.$$

In other words, the matrices W and H are determined such that the following is true:

$$V \approx WH$$

Expressing this element-wisely, the following is true:

$$V_{i,k} \approx (WH)_{i,k} = \sum_{a=1}^{r} W_{i,a} H_{a,k} \tag{2}$$

If the rank r of the factorization satisfies the condition $$(n+m)r < nm$$

then the product WH is a data-compressed representation of V (see [8]). An intuitive explanation of equation (2) is as follows: the matrix $V \in R^{n \times m}$ is approximated as the sum of r external products of a column vector $\overline{w}_i$ and a row vector hi, wherein the following is true: $i \in [1, r]$, $\overline{w}_i \in R^{n \times 1}$ and $\overline{h}_i \in R^{1 \times m}$. The subject-matter described is represented by a simple example in FIG. 4*a*. In other words, FIG. 4*a* shows an illustrative example of a non-negative matrix factorization (NMF) with a factorization rank r=2.

The factors W and H are computed by solving the optimization problem of minimizing a cost function c=f (V,WH) measuring the error of the approximation. In other words, the cost function c measures the error of the approximation, i.e. the distance (and/or the divergence) between the matrices V and WH. An appropriate distance measure between the two matrices A and B is the Frobenius norm $D_F(A,B)$ in its element-wise difference (equation 3):

$$D_F(A, B) = \|A - B\|_F^2 = \sum_{i,k} (A_{i,k} - B_{i,k})^2 \tag{3}$$

The Frobenius norm is ideal for uncorrelated, Gauss-distributed data (see [9]). In other words, a cost function c is computed in one embodiment, wherein the following is true:

$$c = D_F(X(\omega,k), \hat{X}(\omega,k)).$$

In other words, the approximation $\hat{X}(\omega, k)$ is computed as the product of two matrices, W and H, wherein:

$$\hat{X}(\omega,k) = WH.$$

A further known error function is the generalized Kullback-Leibler divergence (GKLD) (equation 4). The generalized Kullback-Leibler divergence (GKLD) is more related to a Poisson distribution (see [9]) or an exponential distribution and therefore even more suitable for an approximation of quantity or magnitude spectra of musical audio signals. The definition of the generalized Kullback-Leibler divergence between two matrices A and B is as follows:

$$D_{GKL}(A, B) = \sum_{i,j} \left( A_{ij} \log \frac{A_{ij}}{B_{ij}} - A_{ij} + B_{ij} \right) \tag{4}$$

Otherwise, $A_{ij}$ and $B_{ij}$ are the entries or matrix elements of the matrices A and B, respectively.

In other words, the cost function c may be selected as follows:

$$c = D_{GKL}(X, \hat{X} = WH).$$

What follows is a description of how the entries of the approximation matrices W and H may be determined. A simple numerical optimization technique known as gradient descent iteratively approaches a local (or global) minimum of the cost function f(x) by applying the update rule and/or iteration rule $$X \leftarrow X + \alpha \cdot \nabla f(X) \tag{5}$$

with the step size $\alpha$ and the gradient $\nabla f(X)$ of the cost function.

For the optimization problem according to equation (2) with the cost function according to equation (3), the additive update rule or iteration rule is given by the following equations:

$$H_{ik} \leftarrow H_{ik} + \alpha \cdot [(W^T V)_{ik} - (W^T WH)_{ik}] \tag{6}$$

$$W_{ik} \leftarrow W_{ik} + \alpha \cdot ([(VH^T)_{ik} - (WHH^T)_{ik}] \tag{7}$$

In the context of the inventive algorithm, in one embodiment the following is true:

$$V = X(\omega,k).$$

It is to be further noted that Lee and Seung have found or identified a multiplicative update rule or iteration rule according to equations (8) and (9) (see [10]). Furthermore, Lee and Seung have shown the relation of the multiplicative update rule to the gradient-descent method and the convergence thereof. The multiplicative update rules are as follows:

$$H_{ik} \leftarrow H_{ik} \frac{(W^T V)_{ik}}{(W^T WH)_{ik}} \tag{8}$$

$$W_{ik} \leftarrow W_{ik} \frac{(VH^T)_{ik}}{(WHH^T)_{ik}} \tag{9}$$

Again, in one embodiment, the following is true:

$$V = X(\omega,k).$$

The speed and robustness of the gradient-descent method strongly depends on the correct choice of the step size or step width $\alpha$. One principal advantage of the multiplicative update rule over the gradient-descent method is the independence of the choice of the step size or the step width. The procedure and method is easy to implement, computationally efficient and guarantees finding a local minimum of the cost function.

Non-Negative Matrix Factorization (NMF) in the Context of Ambience Separation

In the context of the presented method, a non-negative matrix factorization (NMF) is used to compute an approximation of the quantity or magnitude spectrogram I|X(ω,k)| of the input audio signal x[n]. With respect thereto, it is to be noted that the magnitude spectrogram |X(ω,k)| is derived from the matrix X(ω,k) by performing an element-wise magnitude formation. In other words, for the element having the indices i, j from |X(ω,k)|, designated with $|X(\omega,k)|_{ij}$, the following is true:

$$|X(\omega,k)|_{ij} = |X(\omega,k)_{ij}|.$$

$X(\omega,k)_{ij}$ here designates an element of the matrix X(ω,k) with the indices i and j. |.| otherwise designates the operation of magnitude forming.

The non-negative matrix factorization (NMF) of |X| results in factors W and H. In one embodiment, a large factorization rank r between 40 and 100, depending on the signal length and the signal content, is required to represent a sufficient amount of direct sound or direct noise by the approximation.

To sum up, it is shown that by the non-negative matrix factorization described above an approximated representation of the time-frequency distribution is substantially achieved, as it is designated with 222, for example, in the apparatus 200 according to FIG. 2, and as it is further designated with 322 or $\hat{X}(\omega,k)$ in the apparatus 300 according to FIG. 3. A quantity or magnitude spectrogram |A| of the ambient signal is basically derived by computing the difference between the quantity or magnitude representation |X| of the time-frequency distribution X and its approximation WH, as is represented in equation (10):

$$|A|=|X|-WH \tag{10}$$

However, in one embodiment, the result according to equation 10 is not considered directly as will be explained in the following. That is, for approximations minimizing the cost functions described above, the application of the equation (10) results in a quantity or magnitude spectrogram |A| with both negative- and positive-valued elements. As it is, however, advantageous in one embodiment that the quantity or magnitude spectrogram |A| includes positive-valued elements only, it is advantageous to employ a method that handles the negative-valued elements of the difference |X|−WH.

Several methods may be employed for handling the negative elements. One simple approach for handling the negative elements consists in multiplying the negative values with a factor β between 0 and −1 (β=0, . . . −1). In other words: $-1 \leqq \beta \leqq 0$. Here, β=0 corresponds to a half-wave rectification, and β=−1 corresponds to a full-wave rectification.

A general formulation for the computation of the magnitude spectrogram or amplitude spectrogram |A| of the ambient signal is given by the following equations:

$$|A|_{ik} = \beta_{ik} \cdot (|X| - WH)_{ik} \tag{11}$$

with $$\beta_{ik}\begin{cases} \gamma, & \text{if } (WH)_{ik} > |X|_{ik} \\ +1, & \text{otherwise} \end{cases} \tag{12}$$

wherein $\gamma \in [-1,0]$ is a constant.

It is to be noted that in the above equation, $|A|_{ik}$ designates a matrix element with the indices i and k of the magnitude spectrogram or amplitude spectrogram |A|. Furthermore, $(|X|-WH)_{ik}$ designates a matrix element of a difference between the magnitude spectrogram or amplitude spectrogram |X| of the time-frequency distribution and the associated approximation $WH=\hat{X}$, having the indices i and k.

Furthermore, $(WH)_{ik}$ denotes a matrix element of the approximation $WH=\hat{X}$ with the indices i and k. $|X|_{ik}$ is a matrix element of the quantity or magnitude spectrogram |X| with the indices i and k. Therefore, it can be seem from equations (11) and (12) that the factor $\beta_{ik}$ and/or the rectification of the entries of the difference (|X|−WH) is determined element by element in one embodiment.

In the following, an alternative method for determining the quantity or magnitude spectrogram |A| of the ambient signal is described. A simple alternative is obtained by first determining the quantity or magnitude spectrogram |A| of the ambient signal according to $$|A|=|X|-\varsigma \cdot WH,$$

wherein $0 \leqq \varsigma \leqq 1$ and by effecting, following this, a full-wave rectification of negative elements in the thus determined matrix |A|. Here, the parameter ς facilitates setting and/or control of the amount of ambience compared to the direct signal contained in the ambient signal.

It is to be noted that the procedure described last, in contrast to the procedure described with respect to equations (11) and (12) involves the effect, in computing the matrix |A|, that a larger amount of direct sound or direct noise appears in the ambient signal. Therefore, typically, the procedure described in the context of equations (11) and (12) is advantageous.

There is furthermore a further, third alternative procedure for determining the matrix |A|, as it will be described in the following. The third alternative method consists in adding a boundary constraint or boundary condition to the cost function so as to influence the amount or the value of the negative-valued elements in the term $$|A|=|X|-WH$$

In other words, proper choice of the boundary constraint or boundary condition regarding the cost function may serve to achieve that as few negative values as possible (alternatively: as few positive values as possible) may, for example, occur in the difference |A|=|X|−WH.

In other words, the optimization method for determining the entries of the matrices W and H is adapted such that the difference mentioned comprises positive values and/or comparably less negative values (or vice versa).

A new cost function $$c=f(|X|,WH)$$

may be formulated as follows:

$$c = \sum_{i,k} (|X|_{i,k} - (WH)_{i,k})^2 - \epsilon \sum_{i,k} (|X|_{i,k} - (WH)_{i,k}) \tag{13}$$

Here, ϵ is a constant determining the influence of the boundary constraint or boundary condition on the total cost (or on the total value of the cost function c). The update rule and/or iteration rule for the gradient descent is derived by inserting the derivation operator ∂c/∂H (according to equation 14) and the derivation operator ∂c/∂W into equation (5). For the derivation operators ∂c/∂H and ∂c/∂W, the following is true:

$$\frac{\partial c}{\partial H} = \left[(W^T|X|)_{i,k} - (W^T WH)_{ik} - \epsilon \sum_i W_{i,k}\right] \tag{14}$$

$$\frac{\partial c}{\partial W} = \left[(|X|H^T)_{i,k} - (WHH^T)_{ik} - \epsilon \sum_k H_{i,k}\right] \tag{15}$$

Otherwise, it is to be noted that the procedure as described with respect to equations (11) and (12) is advantageous because it is easy to implement and provides good results.

To sum up, it is shown that the determination of the matrix |A| described above, for which three different methods were described, may be executed, for example by the difference determination means 230 or the difference former 330 in embodiments of the present invention.

Reconstruction of the Time Signal

A description follows of how the representation A(ω,k) provided with a phase information (also designated with 336) may be obtained from the magnitude representation IA(ω,k) (also designated with 332) of the ambient signal.

The complex spectrogram A(ω,k) of the ambient signal is calculated using the phase φ=∠X of the time-frequency distribution (TFD) X of the input signal 308 (also designated with x(t), x[n]) is calculated according to equation (16):

$$A(\omega,k)=|A(\omega,k)|\cdot[\cos(\phi(\omega,k))+j\cdot\sin(\phi(\omega,k))] \quad (16)$$

Here, $\phi$ is, for example, a matrix of angle values. In other words, the phase information or angle information of the time-frequency distribution (TFD) X is added element-wisely to the quantity or magnitude representation |A|. In other words, to an entry or matrix element $A_{i,j}$ with a row index i and a column index j, the phase information of an entry or matrix element $X_{i,j}$ with a row index i and a column index j is added, for example by multiplication with a respective complex number of the magnitude 1. The overall result is a representation A(ω,k) of the ambient signal provided with a phase information (designated with 336).

The ambient signal a[n] (or a time-discrete representation of the ambient signal or else a time-continuous representation of the ambient signal) is then (optionally) derived from the representation A(ω,k) provided with a phase information, by subjecting A(ω,k) to an inverse process of computing the time-frequency distribution (TFD). That is, a representation A(ω,k) provided with a phase information is, for example, processed by an inverse short-time Fourier transform with an overlap-and-add scheme resulting in the time signal x[n] when applied to X(ω,k).

The procedure described is otherwise applied to overlapping segments of a few seconds length each. The segments are windowed using a Hann window to ensure smooth transition between adjacent segments.

It is to be noted that the procedures for deriving the time representation a[n] of the ambient signal described last may, for example, be effected in the means 240 for re-synthesis or in the time-frequency-distribution-to-time-signal converter 340.

Assembly of a Multi-Channel Audio Signal

A 5.0 signal or a 5.0 audio signal (i.e., for example, an audio signal comprising a rear left channel, a front center channel, as well as a front right channel, a rear left channel and a rear right channel) is obtained by feeding the rear channels (i.e., for example, at least the rear left channel or the rear right channel, or both the rear left channel and the rear right channel) with the ambient signal. The front channels (i.e., for example, the front left channel, the center channel and/or the front right channel) play back the original signal in one embodiment. Here, for example, gain parameters and/or loudness parameters ensure that a total energy is obtained (or remains substantially unchanged) when the additional center channel is used.

Moreover, it is to be noted that the described concept for generating an ambient signal may be employed in any multi-channel system and multi-channel audio playback systems. For example, the inventive concept may be employed in a 7.0 system (for example in a system having three front loudspeakers, two side loudspeakers and two back loudspeakers). Thus, the ambient signal may, for example, be supplied to one or both side loudspeakers and/or one or both back loudspeakers.

After the separation of the ambience (or after generating the ambient signal), additional processing may optionally be carried out in order to obtain a multi-channel audio signal of high perceptual quality. When assembling a multi-channel audio signal from one single channel, it is desired that the front image is preserved while the impression of spaciousness is added. This is, for example, achieved by introducing or adding delay of a few milliseconds to the ambient signal and/or by suppressing transient portions in the ambient signal. Furthermore, decorrelation of the signals feeding the rear loudspeakers or back loudspeakers among one another and/or in relation to the signals feeding the front loudspeakers is advantageous.

Transient Suppression and/or Suppression of Peaks or Settling Operations

Algorithms for the detection of transients (and/or peaks or settling operations) and for manipulating transients are used in various audio signal processing applications, such as for digital audio effects (see [11, 12]) and for upmixing (see [13]).

The suppression of transients in the context of upmixing aims to maintain the front image. When transient noise or transient sound appear in the ambient signal, sources generating these transients (for example by means of a listener) are not localized in the front. This is an undesired effect: the "direct sound source" either appears wider (or more extended) than in the original or, even worse, is perceived as an independent "direct sound source" in the back of the listener.

Decorrelation of the Signals of the Rear Channels or Back Channels

In the literature, the term "decorrelation" describes a process that manipulates an input signal such that (2 or more) output signals exhibit different waveforms but sound the same as the input signal (see [14]). If, for example, two similar, coherent wide-band noise signals are simultaneously played back or presented by a pair of loudspeakers, a compact auditory event will be perceived (see [15]). Decreasing the correlation of the two channel signals increases the perceived width or extension of the sound source or noise source up until two separate sources are perceived. A correlation of two centered signals x and y (i.e., signals having a mean value of zero) is often expressed by means of the correlation coefficient $R_{xy}$, as it is described by equation (17):

$$R_{xy} = \lim_{l=\infty} \frac{\sum_{k=-l}^{l} x(k)y^*(k)}{\sqrt{\sum_{k=-l}^{l} |x(k)|^2}\sqrt{\sum_{k=-l}^{l} |y(k)|^2}} \quad (17)$$

Here, y*(k) denotes the number conjugated complex to y(k). As the correlation coefficient is not independent of small delays between the signals x and y, another measure for the degree of the similarity between two centered signals x and y is defined by or using the inter-channel correlation Γ (see [15]) or by the inter-channel coherence (see [16]) (equation (18). In equation (18), the inter-channel correlation or inter-channel coherence Γ is defined as follows:

$$\Gamma = \max_{\tau} |r_{xy}(\tau)| \quad (18)$$

Here, the normalized cross-correlation $r_{xy}$ is defined according to equation (19):

$$r_{xy}(\tau) = \lim_{l\to\infty} \frac{\sum_{k=-l}^{l} x(k)y^*(k+\tau)}{\sqrt{\sum_{k=-l}^{l} |x(k)|^2 \sum_{k=-l}^{l} |y(k)|^2}} \quad (19)$$

Examples of decorrelating processes are natural reverberation and several signal processors (flanger, chorus, phaser, synthetic reverberation).

A former method of decorrelation in the field of audio signal processing is described in [17]. Here, two output-channel signals are generated by summation of the input signal and a delayed version of the input signal, wherein in one channel, the phase of the delayed channel is inverted.

Other methods generate decorrelated signals by means of convolution. A pair of output signals with a given or specified correlation measure are generated by convoluting the input signal with a pair of pulse responses that are correlated to each other according to the given value (see [14]).

A dynamic (i.e. time-variable) decorrelation is obtained by using time-variable allpass filters, i.e., allpass filters in which new random phase responses are calculated for adjacent time-frames (see [18], [11]).

In [18], a subband method is described, wherein the correlation in the individual frequency bands is variably changed.

In the context of the inventive method described here, a decorrelation is applied to the ambient signal. In a 5.1 setup (i.e. in a setup with, for example, six loudspeakers) (but also in another setup with at least two loudspeakers) it is desired that the ambient signals that are finally fed to the two rear or back channels are decorrelated relative to each other at least to a certain extent.

The desired properties of the inventive method are sound-field diffusion (or noise-field diffusion or sound-field broadening or noise-field broadening) and envelopment.

Figure 5:
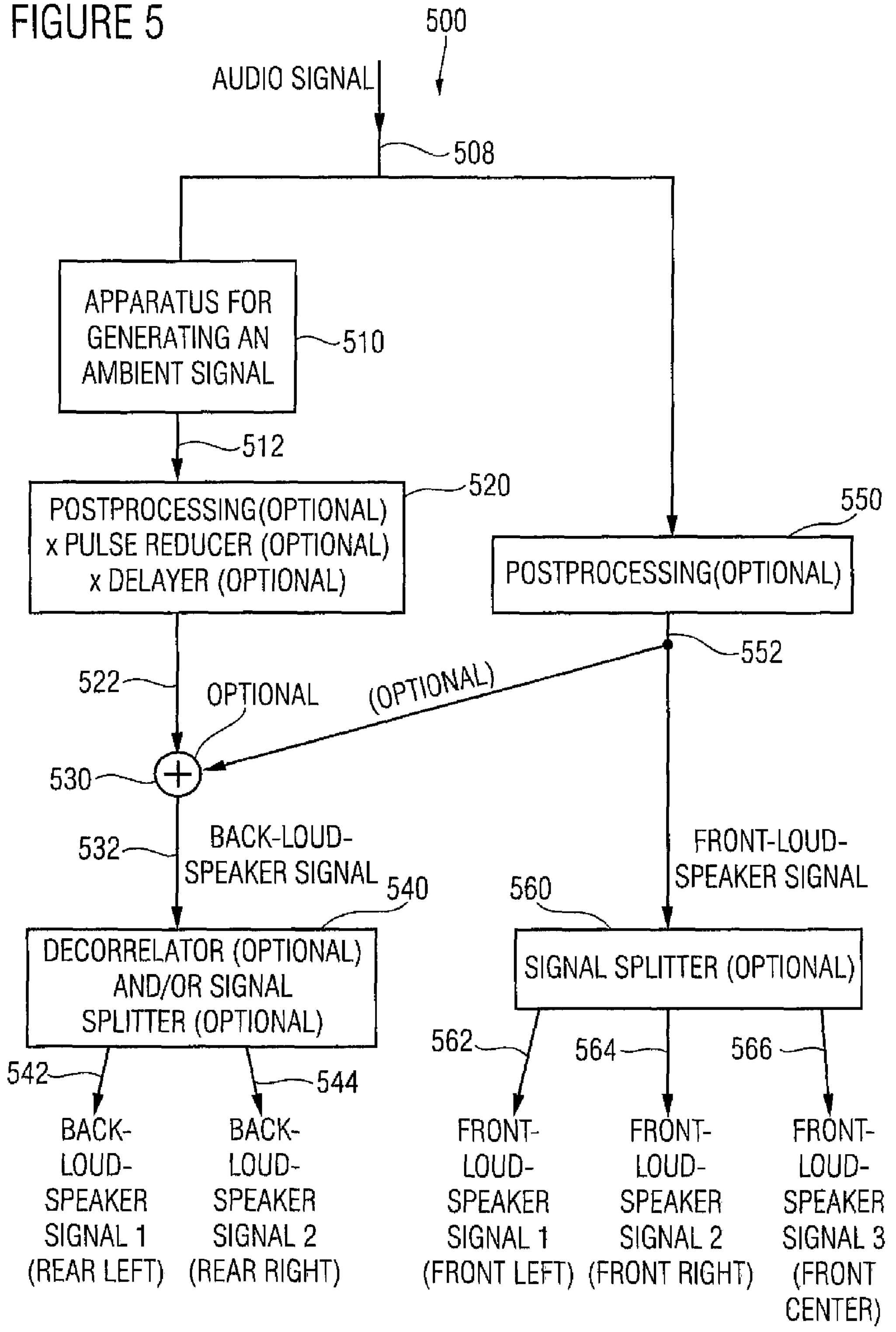
FIG. 5 is a block diagram of an inventive apparatus for deriving a multi-channel audio signal from an audio signal according to an embodiment of the present invention.

In the following and referring to FIG. 5, an apparatus for deriving a multi-channel audio signal comprising a front-loudspeaker signal and a back-loudspeaker signal from an audio signal is described. The apparatus for deriving the multi-channel audio signal according to FIG. 5 is in its entirety designated with 500. The apparatus 500 receives the audio signal 508 or a representation 508 of the audio signal. Apparatus 500 comprises an apparatus 510 for generating an ambient signal, wherein the apparatus 510 receives the audio signal 508 or the representation 508 of the audio signal. The apparatus 510 provides an ambient signal 512. It is to be noted that in one embodiment the apparatus 510 is the apparatus 100 according to FIG. 1. In a further embodiment, the apparatus 510 is the apparatus 200 according to FIG. 2. In a further embodiment, the apparatus 510 is the apparatus 300 according to FIG. 3.

The ambient signal 512, which may be present in the form of a time-domain representation (or time-signal representation) and/or in a time-frequency representation is further fed to postprocessing means 520. The postprocessing means 520 is optional and may, for example, comprise a pulse reducer configured to reduce or remove transients present in the ambient signal 512. Here, the transients are high-energy signal portions that may exhibit an edge steepness greater than a given maximum permissible edge steepness. Moreover, transient events may otherwise also be signal peaks in the ambient signal 512, the amplitudes of which exceed a certain given maximum amplitude.

Furthermore, the postprocessing means 520 may (optionally) comprise a delayer or delaying means delaying the ambient signal 512. The postprocessing means 520 therefore provides a postprocessed ambient signal 522 in which, for example, transients are reduced or removed compared to the (original) ambient signal 512 and/or which is for example delayed compared to the (original) ambient signal 512.

If the postprocessing means 520 is omitted, then the signal 522 may be identical to the signal 512.

The apparatus 500 further (optionally) comprises a combiner 530. If the combiner is included, the combiner 520 for example provides a back-loudspeaker signal 532, which is formed by a combination of the postprocessed ambient signal 522 and an (optionally postprocessed) version of the original audio signal 508.

If the optional combiner 530 is omitted, then the signal 532 may be identical to the signal 522. The apparatus 500 further (optionally) comprises a decorrelator 540, which receives the back-loudspeaker signal 532 and based thereon supplies at least two decorrelated back-loudspeaker signals 542, 544. The first back-loudspeaker signal 542 may, for example, represent a back-loudspeaker signal for a rear left back loudspeaker. The second back-loudspeaker signal 544 may, for example, represent a back-loudspeaker signal for a rear right back loudspeaker.

In the simplest case (for example if the postprocessing means 520, the combiner 530 and the decorrelator 540 are omitted), for example the ambient signal 512 generated by the apparatus 510 is used as the first back-loudspeaker signal 542 and/or as the second back-loudspeaker signal 544. In general, one can say that, in consideration of the postprocessing means 520, the combiner 530 and/or the decorrelator 540, the ambient signal 512 generated by the apparatus 510 is considered for generating the first back-loudspeaker signal 542 and/or for generating the second back-loudspeaker signal 544.

The present invention therefore explicitly comprises using the ambient signal 512 generated by the apparatus 510 as a first back-loudspeaker signal 542 and/or as a second back-loudspeaker signal 544.

Likewise, the present invention explicitly also comprises generating the first back-loudspeaker signal 542 and/or the second back-loudspeaker signal 544 using the ambient signal 512 generated by the apparatus 510.

The apparatus may further, optionally, additionally be configured to generate a first front-loudspeaker signal, a second front-loudspeaker signal and/or a third front-loudspeaker signal. For this purpose, for example, the (original) audio signal 508 is fed to postprocessing means 550. The postprocessing means 550 is configured to receive and process the audio signal 508 and generate a postprocessed audio signal 552, which is, for example, (optionally) fed to the combiner 530. If the postprocessing means is omitted, the signal 542 may be identical to the signal 508. The signal 552 otherwise forms a front-loudspeaker signal.

In one embodiment, the apparatus 500 comprises a signal splitter 560 configured to receive the front-loudspeaker signal 552 and generate, based thereon, a first front-loudspeaker signal 562, a second front-loudspeaker signal 564 and/or a third front-loudspeaker signal 566. The first front-loudspeaker signal 562 may, for example, be a loudspeaker signal for a loudspeaker located front left. The second front-loudspeaker signal 564 may, for example, be a loudspeaker signal for a loudspeaker located front right. The third front-loudspeaker signal 566 may, for example, be a loudspeaker signal for a loudspeaker located front center.

Figure 6:
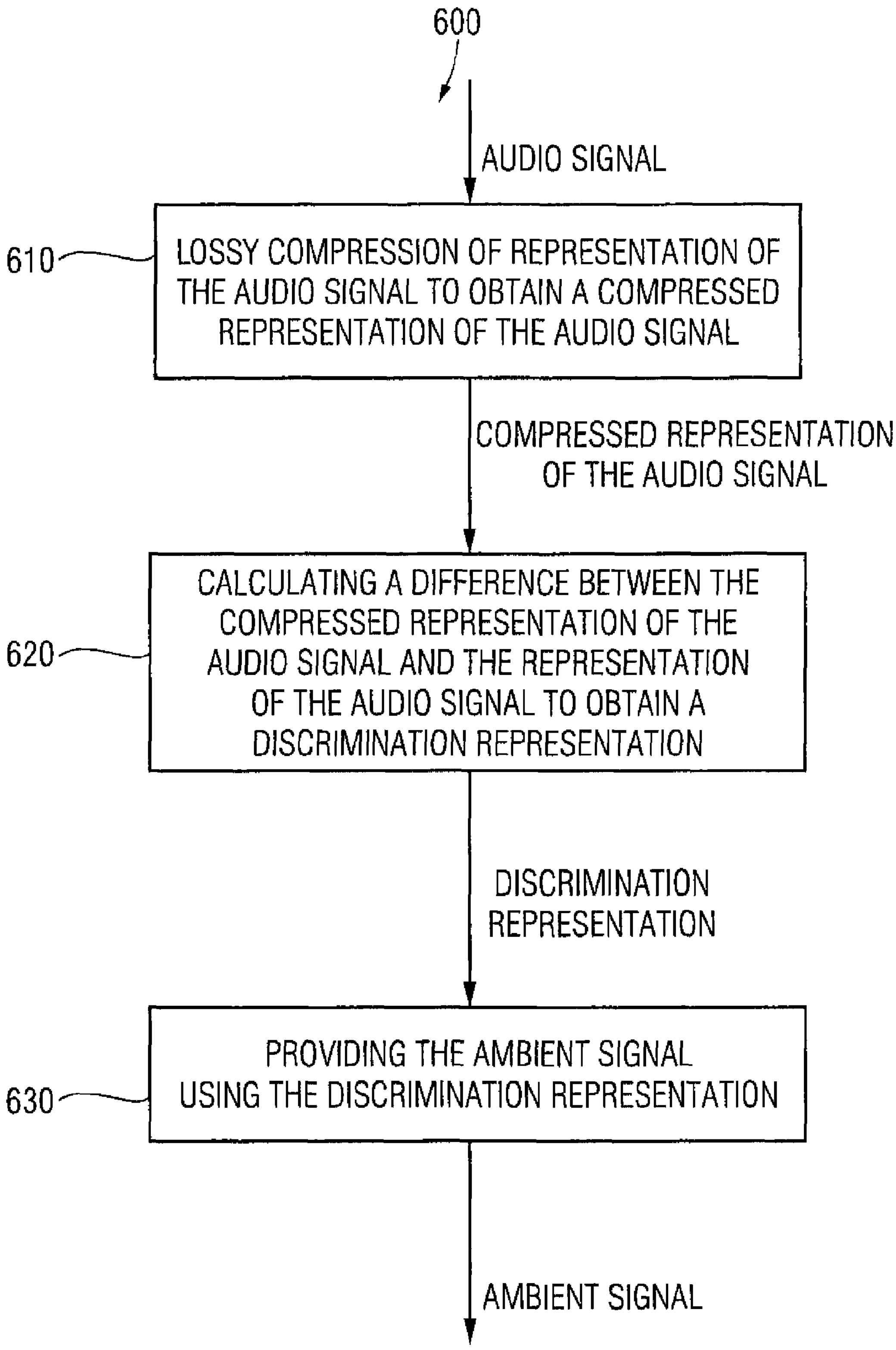
FIG. 6 is a flowchart of an inventive method for creating an ambient signal from an audio signal according to an embodiment of the present invention.
Figure 7:
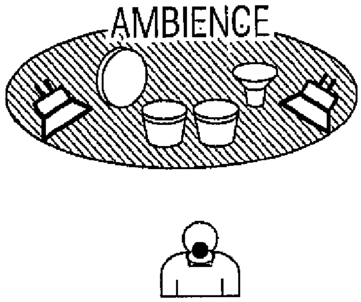
FIG. 7 is a schematic representation of an auditory impression in a stereo playback concept.
Figure 8:
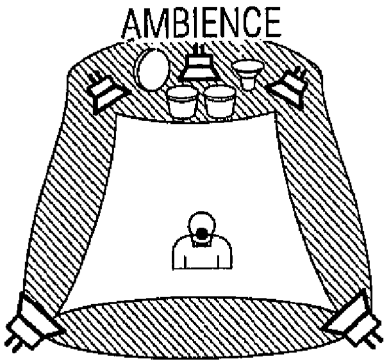
FIG. 8 is a schematic representation of an auditory impression in a Direct/Ambient Concept.
Figure 9:
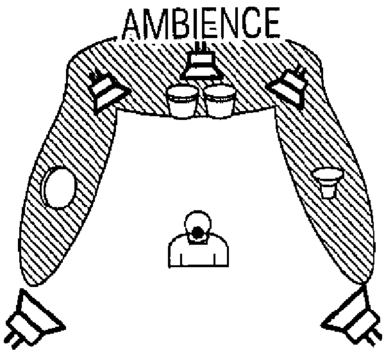
FIG. 9 is a schematic representation of an auditory impression in a surrounding concept.

FIG. 6 otherwise shows a flowchart of an inventive method according to an embodiment of the present invention. The method according to FIG. 6 is in its entirety designated with 600. The method 600 comprises a first step 610. The first step 610 comprises lossy compression of the audio signal (or of a representation of the audio signal) so as to obtain a representation of the audio signal in the manner of lossy compression. A second step 620 of the method 600 comprises calculating a difference between the compressed representation of the audio signal and the representation of the audio signal so as to obtain a discrimination representation.

A third step 630 comprises providing an ambient signal using the discrimination representation. Therefore, as a whole, the method 600 enables the generation of an ambient signal from an audio signal.

It is to be noted here that the inventive method 600 according to FIG. 6 may be supplemented by those steps that are executed by the above inventive apparatuses. Thus, the method may, for example, be modified and/or supplemented so as to fulfill the function of the apparatus 100 according to FIG. 2, the function of the apparatus 200 according to FIG. 2, the function of the apparatus 300 according to FIG. 3 and/or the function of the apparatus 500 according to FIG. 5.

In other words, the inventive apparatus and the inventive method may be implemented in hardware or in software. The implementation may be effected on a digital storage medium such as a floppy disc, a CD, a DVD or a FLASH memory with electronically readable control signals cooperating such with a programmable computer system that the respective method is executed. In general, the present invention therefore thus also consists in a computer program product with a program code for performing the inventive method stored on a machine-readable carrier, when the computer program product runs on a computer. In other words, the invention may therefore be realized as a computer program with a program code for performing the method when the computer program runs on a computer.

Overview of the Method

In summary, it can be said that an ambient signal is generated from the input signal and fed to the rear channels. Here, a concept may be used as it is described under the caption "Direct/Ambient Concept". The quintessence of the invention relates to the calculation of the ambient signal, wherein FIG. 2 shows a block diagram of a processing as it may be used for obtaining the ambient signal.

In summary, the following is shown:

A time-frequency distribution (TFD) of the input signal is calculated as discussed under the caption "Time-frequency distribution of the input signal". An approximation of the time-frequency distribution (TFD) of the input signal is calculated using the method of numerical optimization as described in the section "Approximation of the time-frequency distribution". By calculating a distinction or difference between the time-frequency distribution (TFD) of the input signal and its approximation, an estimate of the time-frequency distribution (TFD) of the ambient signal is obtained. The estimate is also designated with $|A|$ and/or A. A re-synthesis of the time signal of the ambient signal is otherwise explained in the section under the caption "Reconstruction of the time signal". In addition, postprocessing may (optionally) be used for enhancing the auditory impression of the derived multi-channel signal, as it is described under the caption "Assembly of a multi-channel audio signal".

CONCLUSION

In summary, it may be said that the present invention describes a method and concept for separating an ambient signal from one-channel audio signals (or from one one-channel audio signal). The derived ambient signal exhibits high audio quality. It comprises sound elements or noise elements originating from ambience, i.e. reverberance, audience noise as well as ambience noise or environmental noise. The amount or volume of direct sound or direct noise in the ambient signal is very low or even evanescent.

The reasons for the success of the described method may be described as follows in a simplified manner:

The time-frequency distributions (TFD) of direct sound or direct noise are generally sparser or less dense than the time-frequency distributions (TFD) of ambient noise or ambient sound. That is, the energy of direct noise or direct sound is more concentrated in less bins or matrix entries than the energy of ambient noise or ambient sound. Therefore, the approximation detects direct noise or direct sound, but not (or only to a very little extent) ambient noise or ambient sound. Alternatively, it can be said that the approximation detects direct noise or direct sound to a greater extent than ambient noise or ambient sound. The distinction or difference between the time-frequency distribution (TFD) of the input signal and its approximation is therefore a good representation of the time-frequency distribution (TFD) of all ambient noise and/or ambient sound present in the input signal.

Nevertheless, the present invention comprises a method of calculating multi-channel signals (or one multi-channel signal) from a one-channel signal or a two-channel signal (or from one-channel signals or two-channel signals). The use of the described method and concept therefore enables the rendition of conventional recordings on a multi-channel system (or multi-channel systems) in a manner in which the advantages of the multi-signal rendering are maintained.

Moreover, it is to be noted that in the inventive method, in one embodiment, no artificial audio effects are used and that the manipulation of the sound and/or audio signals concerns envelopment and spaciousness only. There is no tone coloring of the original sound or the original noise. The auditory impression intended by the author of the audio signal is maintained.

Therefore, it is to be said that the described inventive method and concept overcomes substantial drawbacks of known methods or concepts. It is to be noted that the signal-adaptive methods described in the introduction calculate the back-channel signal (i.e., the signal for the rear loudspeakers) by calculating inter-channel differences of the two-channel input signal. These methods are therefore not capable of generating a multi-channel signal from an input signal according to option 3 when both channels of the input signal are identical (i.e., when the input signal is a dual-mono signal) or when the signals of the two channels are almost identical.

The method described under the caption "Pseudostereophony based on spatial cues" would require a multi-channel version of the same contents or an operator generating the spatial cues manually. Therefore, the known method mentioned cannot be employed in either one of a real-time-capable manner or automatically when no multi-channel version of the same input signal is available.

In contrast, the inventive method and concept described herein is capable of generating an ambient signal from a one-channel signal without any previous information on the signal. Furthermore, no synthetic audio objects or audio effects (such as reverberance) are used.

In the following, a particularly advantageous choice of parameters for the application of the inventive concept according to an embodiment of the present invention is described.

In other words, in the following, optimal parameter settings for the ambience-separation method for mono-upmix applications are described. Furthermore, minimum and maximum values for the parameters will be given, which, although they may function, do not bring about optimal results with respect to the audio quality and/or the required processing load.

Here, the parameter FFT size (nfft) describes how many frequency bands are processed. In other words, the parameter FFT size indicates, how many discriminable frequencies $\omega_1$ to $\omega_n$ exist. Therefore, the parameter FFT size is also a measure of how large a first dimension (for example a number of matrix rows) of the matrix $X(\omega,k)$ is. In other words, in one embodiment, the parameter FFT size describes the number of rows (or columns) of the matrix $X(\omega,k)$. Therefore, the parameter FFT size for example corresponds to the value n. Furthermore, the value FFT size also describes how many samples are used for the calculation of one single entry $X_{i,j}$ of the matrix X. In other words, nfft samples of a time representation of the input signal are used in order to calculate based thereon nfft spectral coefficients for nfft different frequencies $\omega_1$ to $\omega_{nfft}$. Therefore, based on nfft samples, a column of the matrix $X(\omega,k)$ is calculated.

The window defining the contemplated samples of the input signal is then shifted by a number of samples defined by the parameter hop. The nfft samples of the input signal defined by the shifted window are then mapped to nfft spectral coefficients by a Fourier transform, the spectral coefficient defining a next column of the matrix X.

It may exemplarily be said that the first column of the matrix X may be formed by a Fourier transform of the samples of the input signal with the indices 1 to nfft. The second column of the matrix X may be formed by a Fourier transform of samples of the input signal with the indices 1+hop to nfft+hop.

The parameter segment length indicates how long one segment of a signal frame is, the spectrogram of which is factorized. In other words, the parameter segment length describes how long a time duration of the input audio signal is that is considered for calculating the entries of the matrix X. Therefore, it can be said that the matrix X describes the input time signal over a time period equal to the parameter segment length (segLen).

The parameter factorization rank describes the factorization rank of the non-negative matrix factorization, i.e., the parameter r. In other words, the parameter factorization rank indicates how large a dimension of the first approximation matrix W and a dimension of the second approximation matrix H are.

Advantageous values for the parameters are given in the following chart:

| Parameter | Description | Unit | Min. | Max. | Optimal value |
|---|---|---|---|---|---|
| FFT size (nfft) | Size of a signal frame for FFT | Samples | 1024 | 4096 | 2048 or 4096 |
| Hop size (hop) | Hop size for FFT | Samples | 1 | nfft | 0.125*nfft or 0.20.25* nfft |
| Segment length (segLen) | Size of a signal frame the spectrogram of which is being factorized | Seconds | 1 | Length of the input signal | 2-4 |
| Factorization rank | Factorization rank of NMF | | 10 | Number of columns of the spectrogram | 40 . . . 100 |

As a further parameter, it is further determined which error measure c is used for the calculation of the NMF. The use of the Kullback-Leibler divergence is advantageous when quantity or magnitude spectrograms are processed. Other distance measures may be used when spectrogram values with the logarithm taken (SPL) or energy spectrogram values are processed.

Furthermore, it is to be noted that advantageous value ranges are described above. It is to be noted that, using the inventive method, the FFT size may be in a range from 128 to 65,536. The hop size may be between 1/64 of the FFT size and a unity of the FFT size. The segment length typically amounts to at least 0.1 seconds.

To summarize briefly, one can say that the present invention comprises a new concept or method for calculating an ambient signal from an audio signal. The derived ambient signal is of particular benefit for upmixing music audio signals for playback on multi-channel systems. One advantage of the described inventive concept or method compared to other methods, is its ability to process one-channel signals without using synthetic audio effects.

Furthermore, it is to be noted that the present invention may also be used in a simple system. A system may be contemplated, in which only one front loudspeaker and one back loudspeaker are present and/or active. In this case, for example, the original audio signal may be played back on the front loudspeaker. The ambient signal derived from the original audio signal may be played back on the back loudspeaker. In other words, the original mono audio signal may be played back as a mono signal over one front loudspeaker only, whereas the ambient signal derived from the original audio signal is played back as one single back channel.

If, however, several channels are present, they may be processed individually in an embodiment of the present invention. In other words, a first channel of the original audio signal is considered for generating a first ambient signal, and a second channel of the original audio signal is used for generating a second ambient signal. The first channel of the original audio signal is then played back, for example, on a first front loudspeaker (e.g. front left), and the second channel of the original audio signal is, for example, played back on a second front loudspeaker (e.g. front right). In addition, for example, the first ambient signal is played back on a first back loudspeaker (e.g. rear left), whereas the second ambient signal is, for example, played back on a second back loudspeaker (e.g. rear right).

Therefore, the present invention also comprises generating two back-loudspeaker signals from two front-loudspeaker signals in the manner described.

In a further embodiment, the original audio signal comprises three channels, for example a front left channel, a front center channel and a front right channel. Therefore, a first ambient signal is obtained from the first channel (e.g. front left channel) of the original audio signal. From the second channel (e.g. front center channel) of the original audio signal, a second ambient signal is obtained. From the third channel (e.g. front right channel) of the original audio signal, a third ambient signal is (optionally) obtained.

Two of the ambient signals (e.g. the first ambient signal and the second ambient signal) are then combined (e.g. mixed or combined by weighted or unweighted summation) so as to obtain a first ambience loudspeaker signal, which is fed to a first ambience loudspeaker (e.g. a rear left loudspeaker).

Optionally, in addition, two further ambient signals (e.g. the second ambient signal and the third ambient signal) are combined to obtain a second ambience-loudspeaker signal fed to a second ambience loudspeaker (e.g. a rear right loudspeaker).

Therefore, a first ambience-loudspeaker signal is formed by a first combination of ambient signals, each formed from a channel of the original multi-channel audio signal, whereas a second ambience-loudspeaker signal is formed by a second combination of the ambient signals. The first combination comprises at least two ambient signals, and the second combination comprises at least two ambient signals. Furthermore, it is advantageous that the first combination be different from the second combination, wherein, however, it is advantageous that the first combination and the second combination use a common ambient signal.

Furthermore, it is to be noted that an ambient signal generated in the inventive manner may, for example, also be fed to a side loudspeaker if, for example, a loudspeaker arrangement is used that comprises side loudspeakers. Therefore, an ambient signal may be fed to a left side loudspeaker in a use of a 7.1 loudspeaker arrangement. Furthermore, an ambient signal may also be fed to the right side loudspeaker, wherein the ambient signal fed to the left side loudspeaker differs from the ambient signal fed to the right side loudspeaker.

Therefore, the present invention as a whole brings about particularly good extraction of an ambient signal from a one-channel signal.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Apparatus for generating an ambient signal from an audio signal, comprising:

compressor for a lossy compression of a representation of the audio signal so as to acquire a compressed representation of the audio signal;

calculator for calculating a difference between the compressed representation of the audio signal and the representation of the audio signal so as to acquire a discrimination representation; and provider for providing the ambient signal using the discrimination representation;

wherein the compressor for lossy compression is configured to compress a spectral representation, describing a spectrogram of the audio signal so as to acquire as the compressed representation a compressed spectral representation of the audio signal.

2. Apparatus according to claim 1, wherein the compressor for lossy compression is configured for using, as the spectral representation of the audio signal, a time-frequency-distribution matrix describing a spectrogram of the audio signal, and for approximating the time-frequency-distribution matrix by a product of a first approximation matrix and a second approximation matrix.

3. Apparatus according to claim 2, wherein the compressor for lossy compression is configured for using, as the spectral representation of the audio signal, a real-valued time-frequency-distribution matrix describing a spectrogram of the audio signal.

4. Apparatus according to claim 3, wherein the compressor for lossy compression is configured for using, as the spectral representation of the audio signal, a time-frequency-distribution matrix, the entries of which describe amplitudes or energies in the plurality of frequency domains of the audio signal for a plurality of time intervals.

5. Apparatus according to claim 2, wherein the compressor for lossy compression is configured for using, as the spectral representation of the audio signal, a time-frequency-distribution matrix comprising exclusively non-negative or exclusively non-positive entries.

6. Apparatus according to claim 2, wherein the compressor for lossy compression is configured for approximating the time-frequency-distribution matrix by a product of the first approximation matrix and the second approximation matrix, so that the first approximation matrix and the second approximation matrix comprise exclusively non-negative entries or exclusively non-positive entries, or so that the first approximation matrix comprises exclusively non-negative entries and the second approximation matrix comprises exclusively non-positive entries, or so that the first approximation matrix comprises exclusively non-positive entries and the second approximation matrix comprises exclusively non-negative entries.

7. Apparatus according to claim 2, wherein the compressor for lossy compression is configured for determining entries of the first approximation matrix and entries of the second approximation matrix by evaluating a cost function comprising a quantitative description of a difference between the time-frequency-distribution matrix on the one hand and the product of the first approximation matrix and the second approximation matrix on the other hand.

8. Apparatus according to claim 7, wherein the compressor for lossy compression is configured for determining the entries of the first approximation matrix and the second approximation matrix using a method for determining an extreme value of the cost function or using a method for an approximation to the extreme value of the cost function.

9. Apparatus according to claim 7, wherein the cost function is selected such that the cost function comprises a portion dependent on a sign of a difference between an entry of the time-frequency-distribution matrix on the one hand and an entry of the product of the first approximation matrix and the second approximation matrix on the other hand.

10. Apparatus according to claim 7, wherein the cost function or a boundary condition of the compressor for lossy compression is selected such that in differences between an entry of the time-frequency-distribution matrix on the one hand and an entry of the product of the first approximation matrix and the second approximation matrix on the other hand, values of a first sign are to occur compared to values of a sign inverse thereto.

11. Apparatus according to claim 7, wherein the cost function is configured for determining a Frobenius norm of an element-wise difference between the time-frequency-distribution matrix on the one hand and the product of the first approximation matrix and the second approximation matrix on the other hand.

12. Apparatus according to claim 7, wherein the cost function is configured for determining a generalized Kullback-Leibler divergence of an element-wise difference between the time-frequency-distribution matrix on the one hand and the product of the first approximation matrix and the second approximation matrix on the other hand.

13. Apparatus according to claim 2, wherein the time-frequency-distribution matrix comprises an associated first matrix dimension n and an associated second matrix dimension m;

wherein the first approximation matrix comprises an associated first matrix dimension n and an associated second matrix dimension r;

wherein the second approximation matrix comprises an associated first matrix dimension r and an associated second matrix dimension m; and wherein the following is true:

$$(n+m)r<nm.$$

14. Apparatus according to claim 2, wherein the calculator for calculating a difference is configured for deriving an approximation-error matrix such that elements of the approximation-error matrix are a function of a difference between elements of the time-frequency-distribution matrix on the one hand and elements of the product of the first approximation matrix and the second approximation matrix on the other hand;

wherein the approximation-error matrix forms the discrimination representation.

15. Apparatus according to claim 14, wherein the calculator for calculating a difference is configured for determining, in the calculation of a given entry of the approximation-error matrix, a difference between an entry of the time-frequency matrix associated to the given entry on the one hand and an entry of the product of the first approximation matrix and the second approximation matrix associated to the given entry on the other hand, and for calculating the given entry of the approximation-error matrix as a function of the difference by weighting the difference in dependence on the sign of the difference.

16. Apparatus according to claim 14, wherein the calculator for calculating is configured for determining, in the calculation of a given entry of the approximation-error matrix, a difference between an entry of the time-frequency matrix associated to the given entry on the one hand and an entry of the product of the first approximation matrix and the second approximation matrix, which is weighted by a weighting factor unequal to one associated with the given entry on the other hand, and for determining the given entry of the approximation-error matrix to be a magnitude of the difference.

17. Apparatus according to claim 2, wherein the calculator for calculating the difference between the compressed representation of the audio signal and the representation of the audio signal is configured for describing the difference by a real-valued quantity measure; and wherein the provider for providing the ambient signal is configured for allocating a phase value derived from a representation of the audio signal to the difference, described by the real-valued quantity measure, between the compressed representation of the audio signal and the representation of the audio signal, so as to acquire the ambient signal.

18. Apparatus according to claim 17, wherein the provider for providing is configured for allocating a phase value acquired in the time-frequency-distribution matrix to the difference described by the real-valued quantity measure.

19. Apparatus for deriving a multi-channel audio signal comprising a front-loudspeaker signal and a back-loudspeaker signal from an audio signal, comprising:

an apparatus for generating an ambient signal from an audio signal according to claim 1, wherein the apparatus for generating the ambient signal is configured for receiving the audio signal;

an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

20. Apparatus according to claim 19, wherein the back-loudspeaker-signal-providing apparatus is configured for generating the back-loudspeaker signal such that the back-loudspeaker signal is delayed compared to the front-loudspeaker signal in a range between one millisecond and 50 milliseconds.

21. Apparatus according to claim 19, wherein the back-loudspeaker-signal-providing apparatus is configured for attenuating pulse-like signal portions in the back-loudspeaker signal or for removing the pulse-like signal portions from the back-loudspeaker signal.

22. Apparatus according to claim 19, wherein the back-loudspeaker-signal-providing apparatus is configured for providing, based on the ambient signal provided by the apparatus for generating the ambient signal, a first back-loudspeaker signal for a first back loudspeaker and a second back-loudspeaker signal for a second back loudspeaker.

23. Apparatus according to claim 22, wherein the back-loudspeaker-signal-providing apparatus is configured for providing the first back-loudspeaker signal and the second back-loudspeaker signal based on the ambient signal such that the first back-loudspeaker signal and the second back-loudspeaker signal are at least partially decorrelated from each other.

24. Method for generating an ambient signal from an audio signal, comprising:

lossy compression of a spectral representation of the audio signal, describing a spectrogram of the audio signal, so as to acquire a compressed spectral representation of the audio signal;

calculating a difference between the compressed spectral representation of the audio signal and the representation of the audio signal so as to acquire a discrimination representation; and providing the ambient signal using the discrimination representation.

25. Method for deriving a multi-channel audio signal comprising a front-loudspeaker signal and a back-loudspeaker signal from an audio signal, comprising:

generating the ambient signal from the audio signal according to claim 24;

providing the audio signal or a signal derived therefrom as the front-loudspeaker signal; and providing the ambient signal or a signal derived therefrom as the back-loudspeaker signal.

26. Apparatus for deriving a multi-channel audio signal comprising a front-loudspeaker signal and a back-loudspeaker signal from an audio signal, comprising:

an apparatus for generating an ambient signal from an audio signal, wherein the apparatus for generating an ambient signal from an audio signal comprises:

compressor for a lossy compression of a representation of the audio signal so as to acquire a compressed representation of the audio signal; and calculator for calculating a difference between the compressed representation of the audio signal and the representation of the audio signal so as to acquire a discrimination representation, describing the difference between the representation of the audio signal and the compressed representation of the audio signal, and describing those portions of the audio signal not played back in the lossily compressed representation, and wherein the compressor for lossy compression is configured such that signal portions exhibiting regular distribution of the energy or carrying a large signal energy are to be comprised in the compressed representation;

wherein the discrimination representation forms the ambient signal;

an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

27. Apparatus for deriving a multi-channel audio signal comprising a front-loudspeaker signal and a back-loudspeaker signal from an audio signal, comprising:

an apparatus for generating an ambient signal from an audio signal, wherein the apparatus for generating an ambient signal from an audio signal comprises:

compressor for a lossy compression of a representation of the audio signal so as to acquire a compressed representation of the audio signal, calculator for calculating a difference between the compressed representation of the audio signal and the representation of the audio signal so as to acquire a discrimination representation, describing the difference between the representation of the audio signal and the compressed representation of the audio signal, and describing those portions of the audio signal not played back in the representation in the manner of lossy compression, and provider for providing the ambient signal using the discrimination representation, wherein the compressor for lossy compression is configured such that signal portions exhibiting regular distribution of the energy or carrying a large signal energy are to be comprised in the compressed representation;

wherein the apparatus for generating the ambient signal is configured for receiving the audio signal;

an apparatus for providing the audio signal or a signal derived therefrom as the front-loudspeaker signal; and a back-loudspeaker-signal-providing apparatus for providing the ambient signal provided by the apparatus for generating the ambient signal or a signal derived therefrom as the back-loudspeaker signal.

28. Method for deriving a multi-channel audio signal comprising a front-loudspeaker signal and a back-loudspeaker signal from an audio signal, comprising:

generating the ambient signal from the audio signal, wherein the generation of the ambient signal from the audio signal comprises lossy compression of a representation of the audio signal so as to acquire a compressed representation of the audio signal; and calculating a difference between the compressed representation of the audio signal and the representation of the audio signal so as to acquire a discrimination representation forming the ambient signal, wherein the discrimination representation describes the difference between the representation of the audio signal and the compressed representation of the audio signal, and wherein the discrimination representation describes those portions of the audio signal not played back in the representation in the manner of lossy compression, and wherein the lossy compression is performed such that signal portions exhibiting regular distribution of the energy or carrying a large signal energy are to be comprised in the compressed representation;

providing the audio signal or a signal derived therefrom as the front-loudspeaker signal; and providing the ambient signal or a signal derived therefrom as the back-loudspeaker signal.

29. Method for deriving a multi-channel audio signal comprising a front-loudspeaker signal and a back-loudspeaker signal from an audio signal, comprising:

generating the ambient signal from the audio signal, wherein the generation of the ambient signal from the audio signal comprises lossy compression of a representation of the audio signal so as to acquire a compressed representation of the audio signal;

calculating a difference between the compressed representation of the audio signal and the representation of the audio signal so as to acquire a discrimination representation, and providing the ambient signal using the discrimination representation, wherein the discrimination representation describes the difference between the representation of the audio signal and the compressed representation of the audio signal, and wherein the discrimination representation describes those portions of the audio signal not played back in the representation in the manner of lossy compression, and wherein the lossy compression is performed such that signal portions exhibiting regular distribution of the energy or carrying a large signal energy are to be comprised in the compressed representation;

providing the audio signal or a signal derived therefrom as the front-loudspeaker signal; and providing the ambient signal or a signal derived therefrom as the back-loudspeaker signal.

30. A non-transitory computer readable medium storing a computer program for performing, when the computer program is executed on a computer, a method for generating an ambient signal from an audio signal, the method comprising:

lossy compression of a spectral representation of the audio signal, describing a spectrogram of the audio signal, so as to acquire a compressed spectral representation of the audio signal;

calculating a difference between the compressed spectral representation of the audio signal and the representation of the audio signal so as to acquire a discrimination representation; and providing the ambient signal using the discrimination representation.

31. A non-transitory computer readable medium storing a computer program for performing, when the computer program is executed on a computer, a method for deriving a multi-channel audio signal comprising a front-loudspeaker signal and a back-loudspeaker signal from an audio signal, the method comprising:

generating the ambient signal from the audio signal, wherein the generation of the ambient signal from the audio signal comprises lossy compression of a representation of the audio signal so as to acquire a compressed representation of the audio signal; and calculating a difference between the compressed representation of the audio signal and the representation of the audio signal so as to acquire a discrimination representation forming the ambient signal, wherein the discrimination representation describes the difference between the representation of the audio signal and the compressed representation of the audio signal, and wherein the discrimination representation describes those portions of the audio signal not played back in the representation in the manner of lossy compression, and wherein the lossy compression is performed such that signal portions exhibiting regular distribution of the energy or carrying a large signal energy are to be comprised in the compressed representation;

providing the audio signal or a signal derived therefrom as the front-loudspeaker signal; and providing the ambient signal or a signal derived therefrom as the back-loudspeaker signal.

* * * * *